United States Patent
Beasom

(10) Patent No.: US 7,285,469 B2
(45) Date of Patent: Oct. 23, 2007

(54) BIPOLAR METHOD AND STRUCTURE HAVING IMPROVED BVCEO/RCS TRADE-OFF MADE WITH DEPLETABLE COLLECTOR COLUMNS

(75) Inventor: James Douglas Beasom, Melbourne Village, FL (US)

(73) Assignee: Intersil Americas, Milpitas, CA (US)

( * ) Notice: Subject to any disclaimer, the term of this patent is extended or adjusted under 35 U.S.C. 154(b) by 77 days.

(21) Appl. No.: 11/217,304

(22) Filed: Sep. 2, 2005

(65) Prior Publication Data

US 2007/0052066 A1    Mar. 8, 2007

(51) Int. Cl.
*H01L 21/8222* (2006.01)
(52) U.S. Cl. .................. 438/309; 438/311; 438/322; 438/340; 438/FOR. 165; 438/FOR. 166; 257/197; 257/565; 257/E21.381
(58) Field of Classification Search .......... 438/309, 438/311, 322, 340, FOR. 165, FOR. 166; 257/197, 565, E21.381
See application file for complete search history.

(56) References Cited

U.S. PATENT DOCUMENTS

| | | | |
|---|---|---|---|
| 4,532,003 A | | 7/1985 | Beasom |
| 4,729,008 A | | 3/1988 | Beasom |
| 5,344,785 A | * | 9/1994 | Jerome et al. ............... 438/311 |
| 5,428,233 A | * | 6/1995 | Walczyk .................... 257/273 |
| 5,633,180 A | | 5/1997 | Bajor |
| 2002/0000640 A1 | | 1/2002 | Zhu |
| 2002/0113275 A1 | | 8/2002 | Stecher et al. |
| 2003/0008483 A1 | | 1/2003 | Sato et al. |
| 2004/0212032 A1 | | 10/2004 | Onishi et al. |
| 2004/0238882 A1 | * | 12/2004 | Suzuki et al. ............... 257/330 |

FOREIGN PATENT DOCUMENTS

| | | |
|---|---|---|
| WO | WO 0184631 | 11/2001 |
| WO | WO 2005020275 A2 * | 3/2005 |

OTHER PUBLICATIONS

Jacob Millman, Microelectronics, 1997, McGraw-Hill Book Company, Chapter 3, pp. 57-65.*

* cited by examiner

*Primary Examiner*—Matthew Smith
*Assistant Examiner*—Thanh Van Pham
(74) *Attorney, Agent, or Firm*—MH2 Technology Law Group

(57) ABSTRACT

In accordance with the invention, there are various methods of making an integrated circuit comprising a bipolar transistor. According to an embodiment of the invention, the bipolar transistor can comprise a substrate, a collector comprising a plurality of alternating doped regions, wherein the plurality of alternating doped regions alternate in a lateral direction from a net first conductivity to a net second conductivity, and a collector contact in electrical contact with the collector. The bipolar transistor can also comprise a heavily doped buried layer below the collector, a base in electrical contact with a base contact, wherein the base is doped to a net second conductivity type and wherein the base spans a portion of the plurality of alternating doped regions, and an emitter disposed within the base, the emitter doped to a net first conductivity, wherein a portion of the alternating doped region under the emitter is doped to a concentration of less than about $3 \times 10^{12}$ cm$^{-2}$.

14 Claims, 16 Drawing Sheets

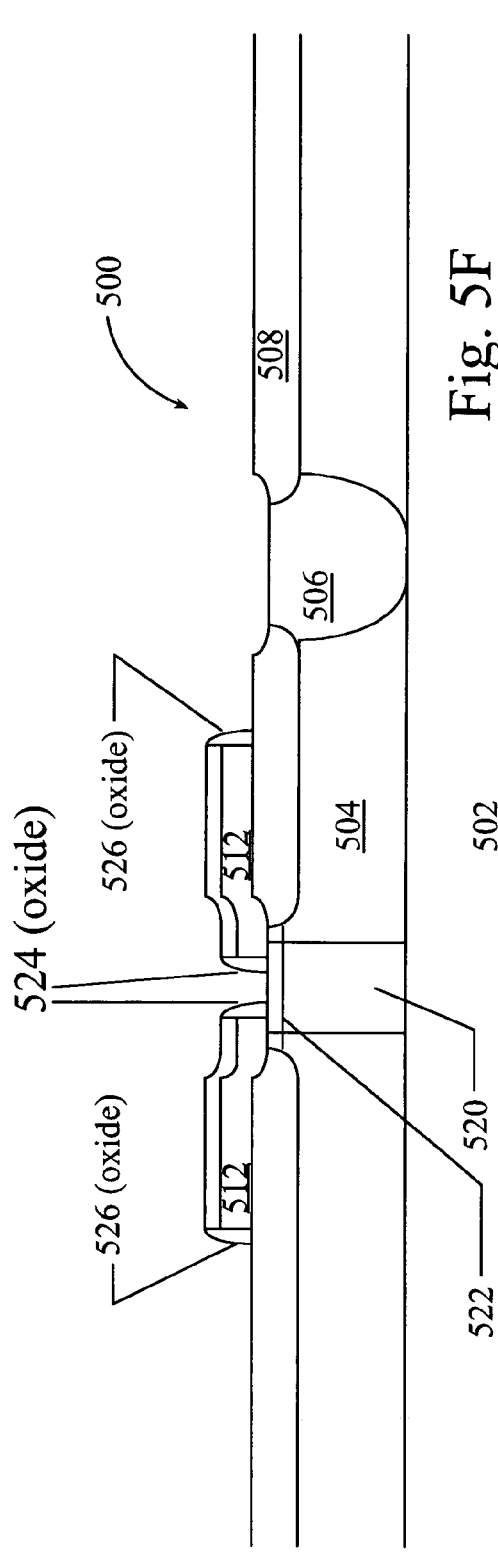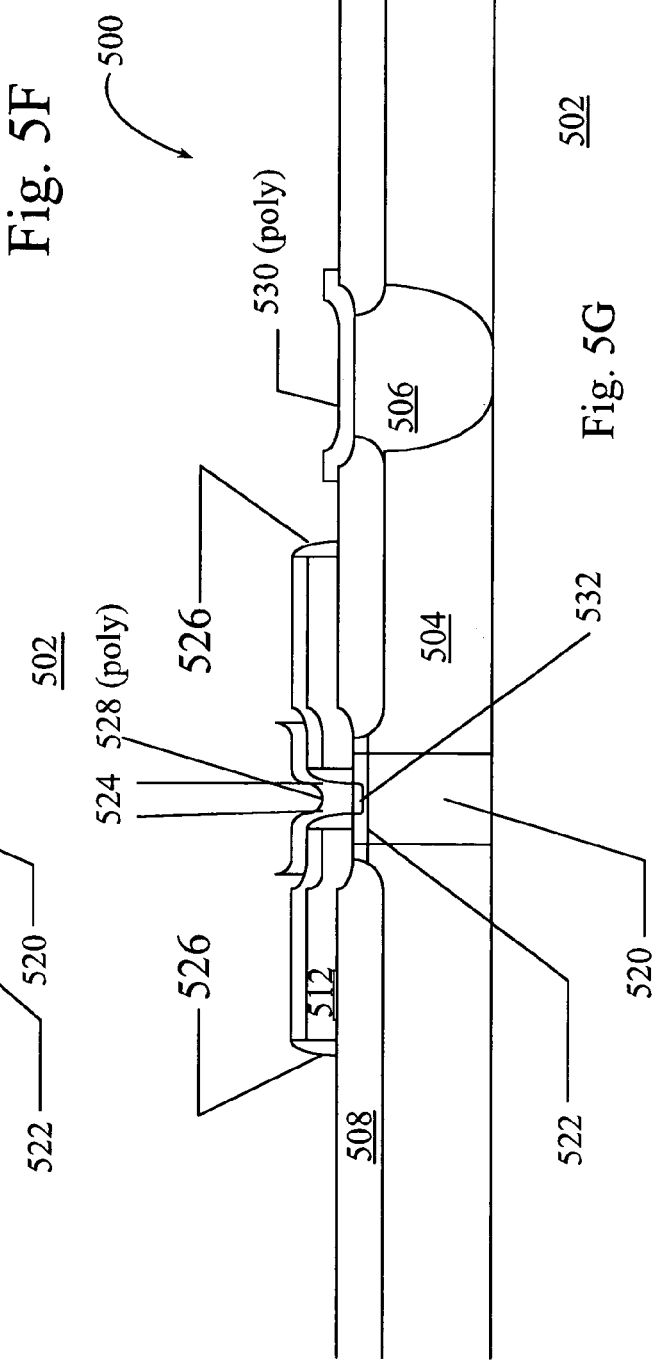
Fig. 5F
Fig. 5G

BIPOLAR METHOD AND STRUCTURE HAVING IMPROVED BVCEO/RCS TRADE-OFF MADE WITH DEPLETABLE COLLECTOR COLUMNS

FIELD OF THE INVENTION

The subject matter of this application relates to integrated circuits having bipolar transistors. More particularly, the subject matter of this application relates to bipolar transistors comprising super junctions.

BACKGROUND OF THE INVENTION

Many bipolar transistors have their size set to meet a required collector resistance ($R_{cs}$). $R_{cs}$ is proportional to collector resistivity and to the length of the collector between the base and buried layer. Thus, to minimize $R_{cs}$, one typically minimizes both collector resistivity and collector length.

FIG. 1 shows a conventional NPN bipolar transistor 100 consisting of an N− collector 102 formed over an N+ buried layer 104, a P base 106 and an N+ sinker 108 formed in the N−collector 102, an N+ emitter 110 and a P+ base contact 112 formed in the P base 106, and an N+ collector contact 114 formed in the N+ sinker 108. In the conventional bipolar transistor, the collector 102 is doped to the same conductivity throughout. The breakdown voltages $BV_{CEO}$ and $BV_{CBO}$ of the conventional bipolar transistor 100 are both reduced when the resistivity of N− collector 102 is reduced. These breakdown voltages are also reduced when the length of the N− collector 102 is reduced to less than the collector depletion layer thickness at breakdown. Thus, there is a tradeoff between breakdown and $R_{cs}$ for bipolar transistors of a given size. Conventional PNP bipolar transistors typically consist of a similar structure but have inverted conductivities.

One approach to increase the breakdown of a transistor with a given collector doping is to cascade the collector with a junction field effect transistor (JFET). The area required for the JFET, however, can consume more area than is saved by reducing the collector doping in some cases so other methods and structures are desired.

Thus, there is a need to overcome these and other problems of the prior art to provide a method and a device to reduce the size of a bipolar transistor while also achieving an improved $R_{cs}$.

SUMMARY OF THE INVENTION

In accordance with the invention, there are various methods of making an integrated circuit comprising a bipolar transistor. According to an embodiment of the invention, the bipolar transistor can comprise a substrate, a collector comprising a plurality of alternating doped regions, wherein the plurality of alternating doped regions alternate in a lateral direction from a net first conductivity to a net second conductivity, and a collector contact in electrical contact with the collector. The bipolar transistor can also comprise a heavily doped buried layer below the collector, a base in electrical contact with a base contact, wherein the base is doped to a net second conductivity type and wherein the base spans a portion of the plurality of alternating doped regions, and an emitter disposed within the base, the emitter doped to a net first conductivity, wherein a portion of the alternating doped region under the emitter is doped to a concentration of less than about $3 \times 10^{12}$ cm$^{-2}$.

According to another embodiment of the invention there is another integrated circuit comprising a bipolar transistor. The bipolar transistor can comprise a substrate, a base formed in the substrate, a collector comprising a doped first region doped to a net first conductivity disposed under the base, wherein the base is doped to a net second conductivity type, and doped second regions doped to a net second conductivity disposed on opposite sides of the doped first region, and a collector contact in electrical contact with the collector. The bipolar transistor can also comprise a more heavily doped layer buried below the doped first region and the doped second regions, and an emitter doped to a net first conductivity disposed within the base, wherein the doped region disposed beneath the emitter depletes at a reverse bias collector base voltage of magnitude less than an absolute value of $BV_{CEO}$.

According to another embodiment of the invention there is a method of forming an integrated circuit comprising a bipolar transistor. The method can comprise forming a device layer doped over a substrate, forming a buried region in the device layer, and forming a first layer doped to a net first conductivity over the device layer. The method can also comprise forming at least one second conductivity type region using a dopant material of a second conductivity type in the first layer, wherein the at least one second conductivity type region is bounded by at least one region doped to the first conductivity type, forming a base region in the first layer, and forming an emitter in a portion of the base region.

According to another embodiment of the invention there is a method of making a bipolar transistor. The method can comprise forming a device layer over a substrate, forming a buried region under the device layer, and forming a patterned layer over the device layer, wherein the patterned layer comprises an opening that exposes a portion of the device layer. The method can also comprise providing dopants of a first conductivity type to the exposed portion of the device layer to form a column of first conductivity type dopants in the device layer, providing dopants of a second conductivity type to the exposed portion of the device layer to form an intrinsic base in the device layer, forming an emitter that contacts a portion of the exposed device layer, and forming an emitter contact over the emitter.

According to another embodiment of the invention there is a method of making a bipolar transistor. The method can comprise forming a device layer over a substrate, forming a buried region under the device layer, forming a patterned insulator over the device layer, wherein the patterned insulator comprises a first opening that exposes a first portion of the device layer, providing dopants of a first conductivity type to the exposed first portion of the device layer to form a base in the device layer, and forming a patterned base insulator over the exposed first portion of the device layer, wherein the patterned base insulator comprises a second opening that exposes an area of the first portion of the device layer. The method can also comprise providing dopants of a second conductivity type to the exposed area of the first portion of the device layer to form a column of second conductivity type dopants in the device layer, forming an emitter that contacts a portion of the exposed area of the first portion of the device layer, and forming an emitter contact over the emitter.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIGS. 5A-5I depict schematic representations of a method form forming an integrated circuit device comprising a PNP double polycrystalline silicon bipolar transistor architecture comprising a super junction structure according to various embodiments of the invention.

DESCRIPTION OF THE EMBODIMENTS

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, not to be taken in a limited sense.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 1:
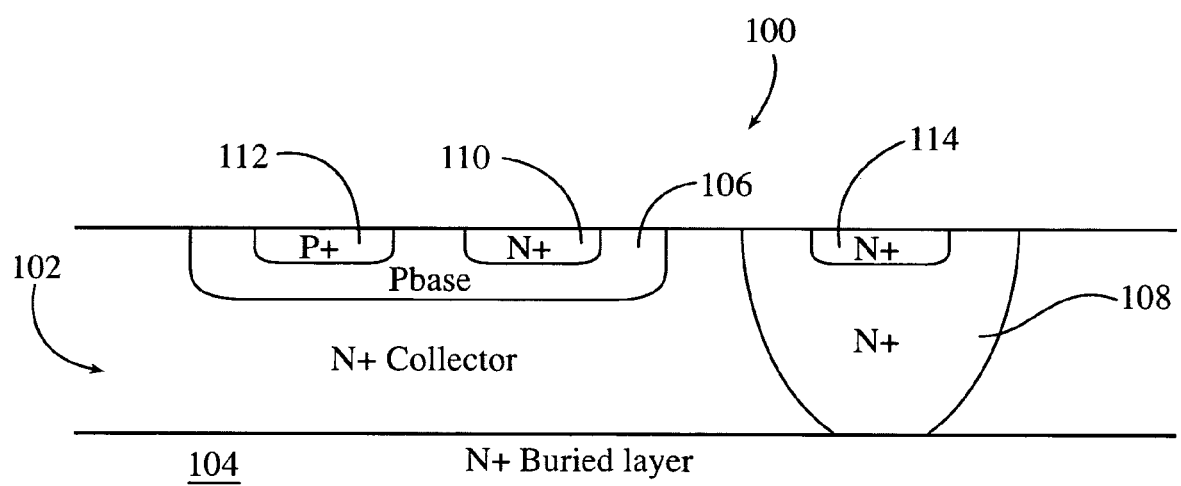
FIG. 1 shows a conventional NPN bipolar transistor.
Figure 2A:
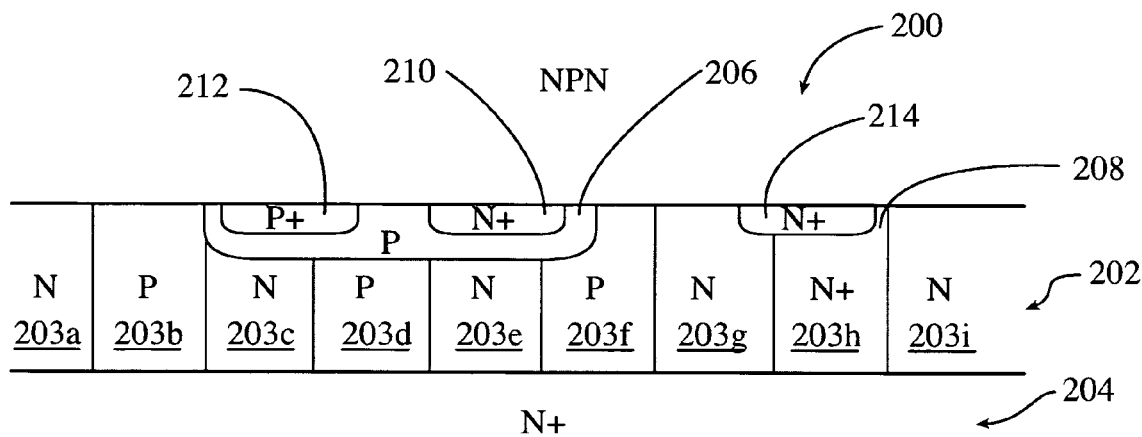
FIG. 2 depicts a schematic representation of a super junction.
Figure 2B:
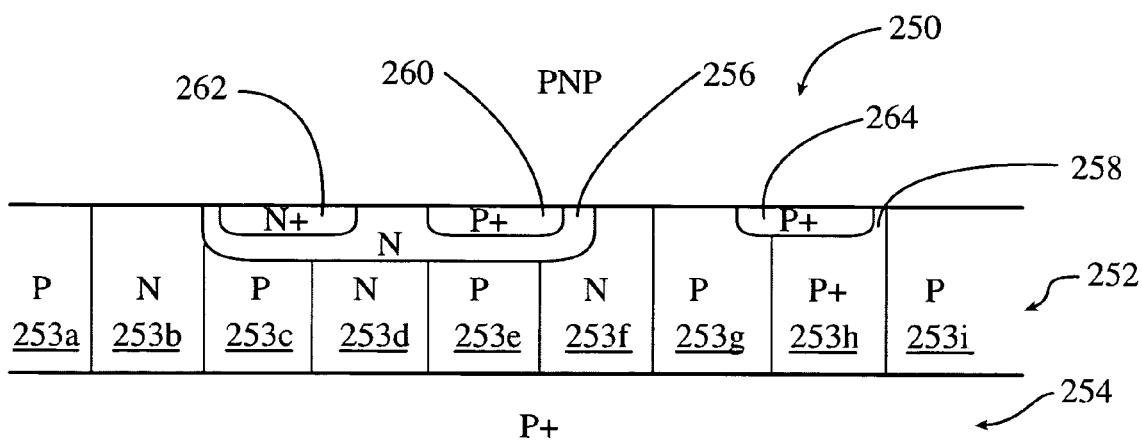

Prior to discussing the specific features of the exemplary embodiments, a discussion of a super junction structure is provided. According to various embodiments, a super junction structure can be formed at the collector-base junction in an NPN bipolar transistor 200 and a PNP bipolar transistor 250 as shown in FIG. 2A and FIG. 2B, respectively. Generally, a super junction structure is a structure that allows the doping on the lightly doped side of a PN junction to be increased and the length of the lightly doped side to be reduced as compared to the same junction in a conventional device for a given breakdown voltage. In a bipolar transistor device, the uniform collector doping, such as that shown in conventional device 100 of FIG. 1 is replaced with alternative P and N doped columns, such as those shown in FIGS. 2A and 2B. Moreover, the doping of the columns can be matched. For example, the thickness of the P column times its doping can be equal to the thickness of the N column times its doping.

The thickness of the columns can be determined such that when the junction is reverse biased, they totally deplete before breakdown is reached. The super junction column properties can be expressed as:

$$t_N * N_D = t_p * N_A \quad [1]$$

where $t_N$=thickness of the N column, $N_D$=doping of the N column, $t_p$=thickness of the P column, and $N_A$=doping of the N column; and $$t_{max} = 2E_{max} * \epsilon/q * N \quad [2]$$

where $t_{max}$=maximum thickness of the column, $E_{max}$=maximum electric field before breakdown occurs, $\epsilon$=dielectric constant of the substrate, such as silicon, N=doping level of the column.

The doping of the depletable columns is disconnected from breakdown because once it depletes, a constant electric field extends the length of the column. Breakdown is approximated by:

$$BV = E_{crit} * l \quad [3]$$

where BV=breakdown voltage, $E_{crit}$=critical electric field for breakdown, I=length of the column.

The depletable columns of a super junction can be used to form drain regions that have shorter and higher doped layers than in conventional DMOS structures of the same breakdown voltage. In particular, they provide reduced "on" resistance in a given area.

Super junctions can also be applied to reduce $R_{cs}$ in bipolar transistor devices. Moreover, similar column structures can be used to improve both NPN and PNP bipolar transistor devices, such as when both devices are formed in the same wafer.

Turning to FIG. 2A, a schematic representation of an NPN bipolar transistor 200 is shown that comprises a collector, generally referred to as 202, formed over an N+ buried layer 204, a P base 206 and an optional N+ sinker 208 formed in the collector 202, an N+ emitter 210 and a P+ base contact 212 formed in the P base 206, and an N+ collector contact 214 formed in the optional N+ sinker 208. The doping of the collector 202 comprises alternating N and P doped regions or columns 203a-i.

In FIG. 2B, a schematic representation of PNP bipolar transistor 250 is shown that comprises a collector, generally referred to as 252, formed over a P+ buried layer 254, an N base 256 and an optional P+ sinker 258 formed in the collector 252, a P+ emitter 260 and an N+ base contact 262 formed in the N base 256, and a collector contact 264 formed in the optional P+ sinker 208. The doping of the collector 252 comprises alternating P and N doped regions or columns 253a-i.

As shown in FIG. 2A, at least the region under the base 206 comprises alternating N and P columns 203c-203f. Similarly in FIG. 2B, at least the region under the base 256 comprises alternating N and P columns 253c-253f.

The steps used to form the N and P columns can be similar for the NPN bipolar transistor device as for the PNP bipolar transistor device. For example, the NPN can be formed over an N+ buried layer, such as N+ buried layer 204, and the PNP can be formed over a P+ buried layer, such as P+ buried layer 254. Further, the collector contact 214 can be formed in an N column, such as 203h. Alternatively an optional N+ sinker, such as sinker 208, can be formed through N and/or P columns, such as columns 203g and 203h, to connect the buried layer to the surface of the device. The PNP collector contact can be formed in a similar manner to that of the NPN but with the conductivity types inverted.

In prior art super junctions, the integrated doping of the P and N columns may require matching. According to various embodiments of the invention, there is provided a super junction structure that relaxes the matching requirements while at the same time, retaining the $R_{cs}$ improvement, at least for bipolars designed to meet a required $BV_{CEO}$.

According to various embodiments, a bipolar transistor device can be provided that comprises a super junction structure comprising at least one depletable column of a first conductivity type located under an emitter. The depletable column can be formed adjacent to at least one column doped to a second and opposite conductivity type. According to various embodiments, second conductivity type columns can be formed adjacent to each side of the depletable column. The adjacent columns can have doping high enough so that these columns do not totally deplete under reverse bias.

For example, the column under the emitter can be designed to deplete at a reverse bias voltage applied to the collector and the base with a magnitude that is less than the absolute value of $BV_{CEO}$. Moreover, in contrast to conventional structures, structures described herein can comprise columns (such as P-type columns) of opposite conductivity adjacent to collector columns (such as an N-type column) located below the emitter. According to various embodiments, a depletion layer can spread out from the vertical junction between P-type an N-type columns when the collector base junction is reverse biased. The thickness and doping of the N-type column can be determined using equations 1 and 2 described herein to insure that the N-type column totally depletes. This is also in contrast to conventional structures that cannot provide similar depletion across the entire length of the collector from a vertical junction. Conventional structures can only deplete from the horizontal junction between the base and the collector. And in some embodiments, the depletable column can be designed to totally deplete before $BV_{CEO}$ occurs in the column.

According to various embodiments, the depletion characteristics of the columns can be achieved by controlling the doping of the column under the emitter. As discussed above, the depletable column under the emitter doped to the first conductivity and the columns of the second conductivity can be formed adjacent to the column under the emitter. According to various embodiments, the doping in a horizontal direction between the adjacent second conductivity type columns can be less than about 3E12 atoms/cm². In some cases, this doping can be less than about 1E12 atoms/cm². This doping can be derived using equation [2] for $t_{max}$ shown above using a suitable $E_{max}$. It is to be noted that $E_{max}$ can be a slowly decreasing function of breakdown voltage. As such, there may not be a single solution for all voltages.

According to various embodiments of the invention, the length of the columns can be controlled to provide a given breakdown voltage. For example, the general length of the depletable column under the emitter, between the base and the buried layer, can be determined by $BV_{CEO}$. Thus, the length of column can be determined using equation [3] above. In an exemplary embodiment, $E_{crit}$ may be 2E5 V/cm. It is to be noted that $E_{crit}$ can decrease slowly as the voltage increases so the results obtained from equation [3] may slightly underestimate the minimum attainable voltage for low voltage (erg., about 30 V) devices. However, this calculation can be used as a general guide line to determine the length of the base to the buried layer.

Figure 3A:
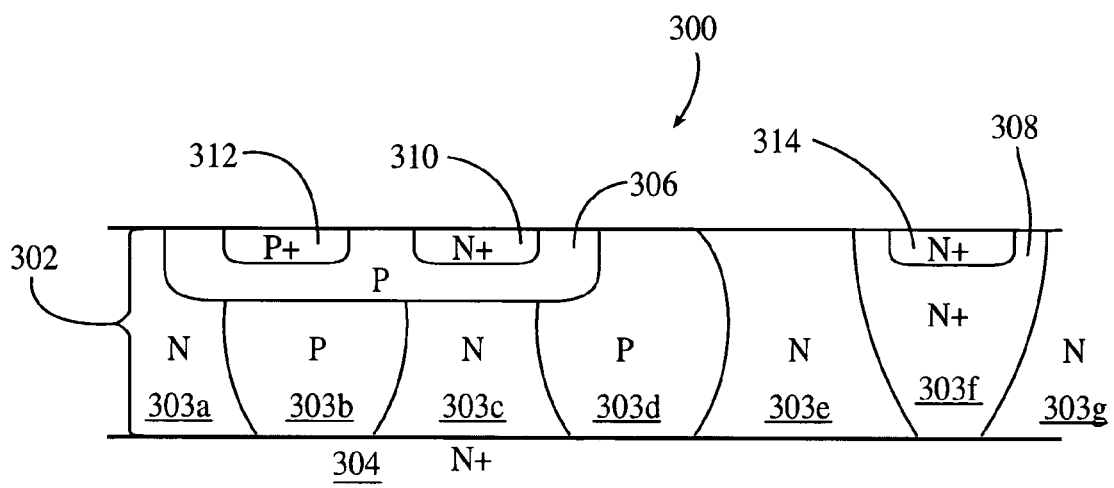
FIG. 3A depicts a schematic representation of an NPN bipolar transistor comprising a super junction structure according to various embodiments of the invention.
Figure 3B:
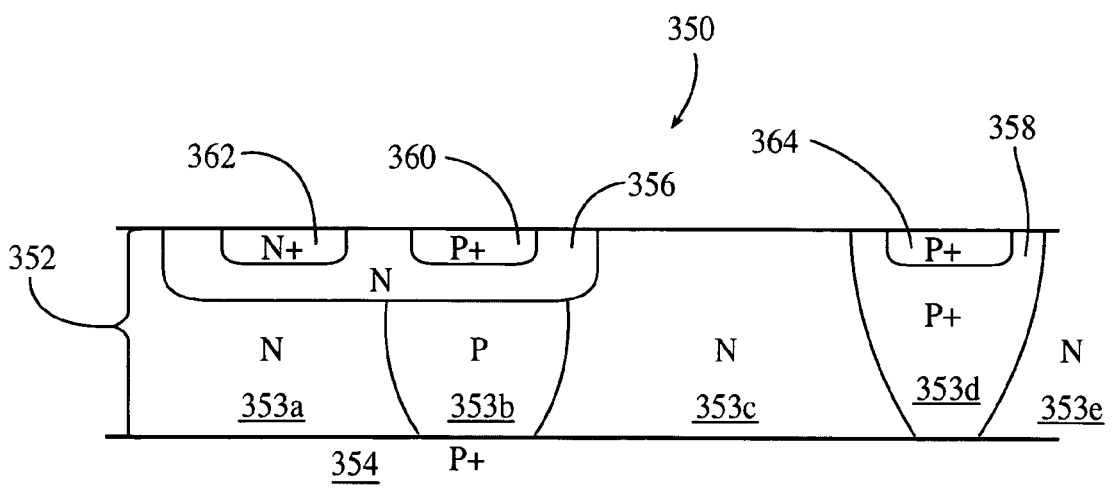
FIG. 3B depicts a schematic representation of a PNP bipolar transistor comprising a super junction structure according to various embodiments of the invention.

FIGS. 3A and 3B depict NPN and PNP bipolar transistor devices 300 and 350, respectively, having super junction structures such as those described herein. In FIG. 3A, the NPN bipolar transistor 300 comprises a collector, generally referred to as 302, formed over an N+ buried layer 304, a P base 306 and an optional N+ sinker 308 formed in the collector 302, an N+ emitter 310 and a P+ base contact 312 formed in the P base 306, and a collector contact 314 formed in the optional N+ sinker 308. NPN bipolar transistor 300 can also comprise alternating P and N doped regions or columns (labeled 303a-e). Moreover, NPN bipolar transistor 300 can comprise alternating N and N+ regions (303e-g), which can be considered a single N-type column.

In FIG. 3B, the PNP bipolar transistor 350 comprises a collector, generally referred to as 352, formed over a P+ buried layer 354, an N base 356 and an optional P+ sinker 358 formed in the collector 352, a P+ emitter 360 and an N+ base contact 362 formed in the N base 356, and a collector contact 364 formed in the optional P+ sinker 308. PNP bipolar transistor 350 can also comprise alternating N and P doped regions or columns (labeled 353a-e).

According to various embodiments, the NPN bipolar transistor 300 and the PNP bipolar transistor 350 comprise deplateable columns 303c and 353b, respectively, under the emitters 310 and 360, respectively. The depletable columns 303c and 353b are bounded on two sides by opposite conductivity type columns, such as 303b and 303d, and 353a and 353c, respectively, that do not totally deplete. This is in contrast to conventional superjunction structures that can have alternating P and N columns all of which totally deplete. Moreover, the embodiments of the present invention described herein require fewer columns than conventional devices.

According to various embodiments, the layers that are used to make the columns shown in FIG. 3A and FIG. 3B can also be used to make collectors of conventional structure bipolar devices, such as those shown in FIG. 1, that have a lower $BV_{CEO}$ and that are formed on other areas of the integrated circuit. Thus, it is possible to use common process steps to make two sets of bipolar devices having two different breakdown voltages.

An integrated circuit device having multiple bipolar transistors devices comprising a super junction structure, where one of the columns of the super junction structure is self-aligned to the emitter is contemplated. An example of forming such an integrated circuit device is shown in FIGS. 4A-4E. Further, a method of forming a double polycrystalline silicon ("polysilicon" or "poly") bipolar transistor architecture is shown in FIGS. 5A-5I and a method of forming a single poly transistor architecture is shown in FIGS. 6A-6I. The bipolar transistors can comprise a depletable column of the super junction structure that is self-aligned to the emitter. Moreover, various methods of making bipolar transistor devices, some of which are described herein, comprise the use of multiple ion implantations at various energies to form the collector columns without the use of multiple epitaxial collector layer depositions.

Figure 4A:
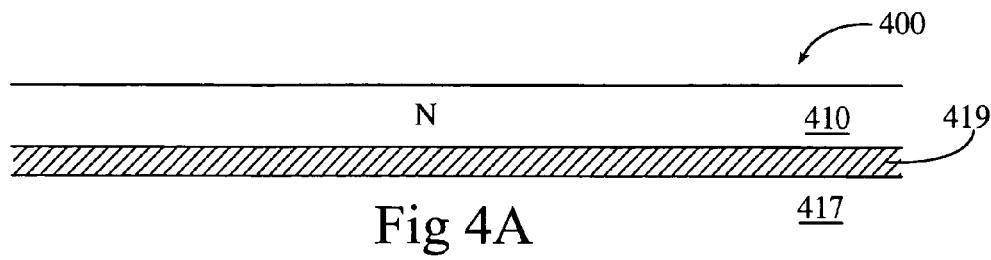
FIGS. 4A-4E depict schematic representations of a method for forming an integrated circuit device comprising an NPN and a PNP bipolar transistor comprising a super junction structure according to various embodiments of the invention.

As stated above, a depiction of a method for forming NPN and PNP bipolar transistors devices comprising super junction structures on the same integrated circuit is shown in FIGS. 4A-4E. In FIG. 4A, a device layer 410, such as an N-type epitaxial layer, can be formed over a substrate 415. According to various embodiments, the device layer 410 can have a thickness in the range of about 2 μm to about 15 μm. The substrate 415 can comprise a semiconductor wafer 417, such as silicon, and a bond oxide 419. According to various embodiments, the device layer 410 can be bonded to the semiconductor wafer 417 with the bond oxide 419 to facilitate handling.

Figure 4B:
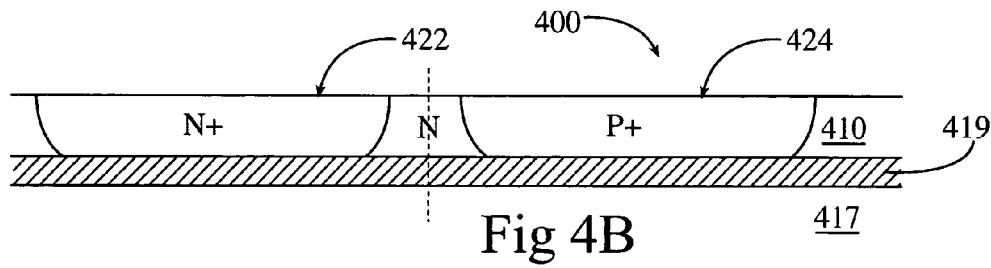

In FIG. 4B, heavily doped N+ and P+ buried regions 422 and 424 can be formed in the device layer 410. According to various embodiments, the heavily doped N+ buried region 422 can be formed by masking and ion implanting N-type ions into a portion of the device layer 410. Similarly, the heavily doped P+ buried region 424 can be formed by masking and ion implanting P-type ions into another portion of the device layer 410. Heavily doped N+ buried region 422 can serve as the buried region for the NPN device and heavily doped P+ buried region 424 can serve as the buried region for the PNP device. According to various embodiments, the N+ buried region 422 can be made by implanting phosphorous (or another N-type dopant) with an energy of about 70 KeV to about 130 KeV and a dose of about 8E14 ions/cm$^2$ to about 3E15 ions/cm$^2$. In still further embodiments, the N+ buried region 422 can be made by implanting phosphorous (or another N-type dopant) with an energy of about 100 KeV and a dose of about 1E15 ions/cm$^2$. According to various embodiments, the P+ buried region 424 can be made by implanting BF$_2$ (or another P-type dopant) with an energy of about 20 KeV to about 40 KeV and a dose of about 8E14 ions/cm$^2$ to about 3E15 ions/cm$^2$. In still further embodiments, the P+ buried region 424 can be made by implanting BF$_2$ (or another P-type dopant) with an energy of about 30 KeV and a dose of about 1E15 ions/cm$^2$. According to some embodiments, buried regions 422 and 424 can be formed using a diffusion process.

Figure 4C:
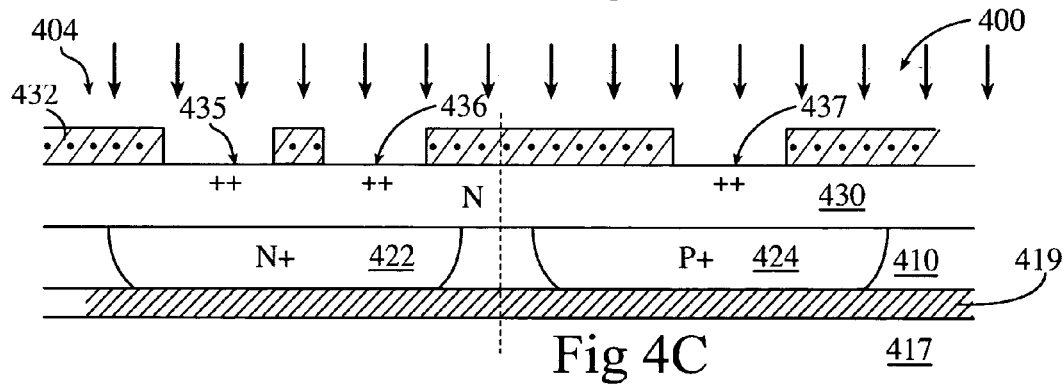

As shown in FIG. 4C, a first epitaxial layer 430 is formed over the device layer 410. According to various embodiments, the first epitaxial layer 430 can be doped N-type. Subsequently, the first epitaxial layer 430 can be masked and implanted with dopants that will form the collector. For example, the first epitaxial layer 430 can be masked, shown for example with mask layer 432, to allow P-type ions 434 to be implanted into regions 435 and 436 of the first epitaxial layer 430 above the buried region 422 when the first epitaxial layer 430 is doped N-type. The mask layer 432 can also be defined to allow P-type ions 434 to be implanted into one region 437 of the first epitaxial layer 430 above the buried region 424 when the first epitaxial layer 430 is doped N-type. According to various embodiments, the P-type ions, such as boron or the like, can be implanted with an energy from about 150 KeV to about 220 KeV and a dose from about 1E12 ions/cm$^2$ to about 1E13 ions/cm$^2$. In still further embodiments, the P-type ions, such as boron or the like, can be implanted with an energy of about 180 KeV and a dose of about 5E12 ion/cm$^2$. According to various embodiments, the dose can be chosen so as to provide the appropriate doping required for the desired breakdown voltage after the ions are diffused.

Figure 4D:
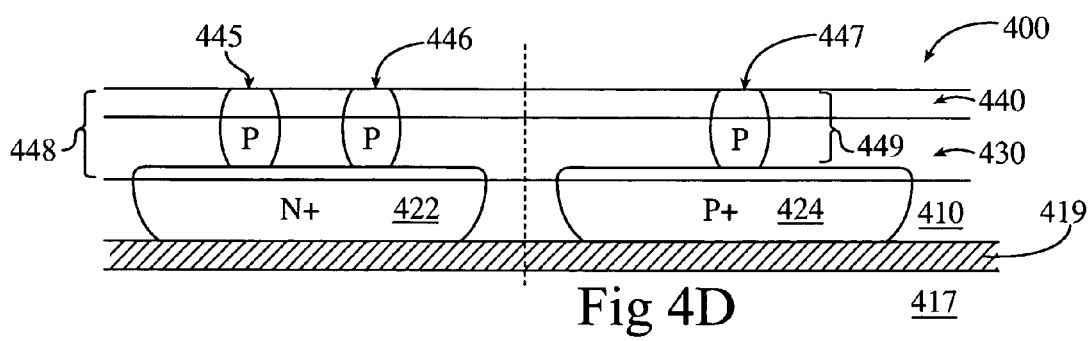

As shown in FIG. 4D, a second epitaxial layer 440 can be formed over the first epitaxial layer 430. According to various embodiments, the second epitaxial layer 440 can be doped N-type. Portions of the first epitaxial layer 430 and the second epitaxial layer 440 form the region that will be, generally, collector 448 and collector 449, in the NPN and PNP bipolar transistors, respectively. Subsequently, the integrated circuit 400 can be heated to allow the dopants 434 implanted into regions 435, 436, and 437 to diffuse and form the P-type columns 445, 446 in the NPN collector 448 and to form P-type column 447 in the PNP collector 449. According to various embodiments, the NPN collector 448 doping can be from about 1E15 ions/cm$^2$ to about 5E16 ions/cm$^2$. For a BVCEO of about 70V, a doping of about 2E15 ions/cm$^2$ can be used. Further, the columns 445 and 446 can have a length of about 5 microns and a thickness of about 8 microns for a device having a BVCEO of about 70V. Moreover, equations 1 and 2, as set forth herein, can be used to set the length and thickness for a desired breakdown voltage. Still further, the thickness of the column under the emitter can be greater than the similar dimension of the emitter above it so that substantially the entire emitter lies above a collector column of like conductivity type. According to various embodiments, the PNP collector 449 doping can be from about 1E15 ions/cm$^2$ to about 1E17 ions/cm$^2$ and in some embodiments, about 4E15 ions/cm$^2$. Further, for a device with a BVCEO of about 70V, the column 447 can have a length of about 4 microns and a thickness of about 4 microns. Moreover, equations 1 and 2, as set forth herein, can be used to set the length and thickness for a desired breakdown voltage. Still further, the thickness of the column under the emitter can also be greater than the similar dimension of the emitter above it so that substantially the entire emitter can lie above a collector of like conductivity type.

According to various embodiments, the N-type columns of the transistors can be formed from the two N-type epitaxial layers 430 and 440. Further, the P-type columns can be formed from the P-type implant into the epitaxial layers 430 and 440. Moreover, the P-type implant is diffused down to the N+ and P+ buried regions 422 and 424, respectively, and up through the second N epitaxial layer 440 after it is deposited. While the figures show two columns formed in the NPN collector 448 and one column formed in the PNP collector 449, it is to be understood that more columns can be formed. Moreover, the above described procedure can be carried out multiple times.

Figure 4E:
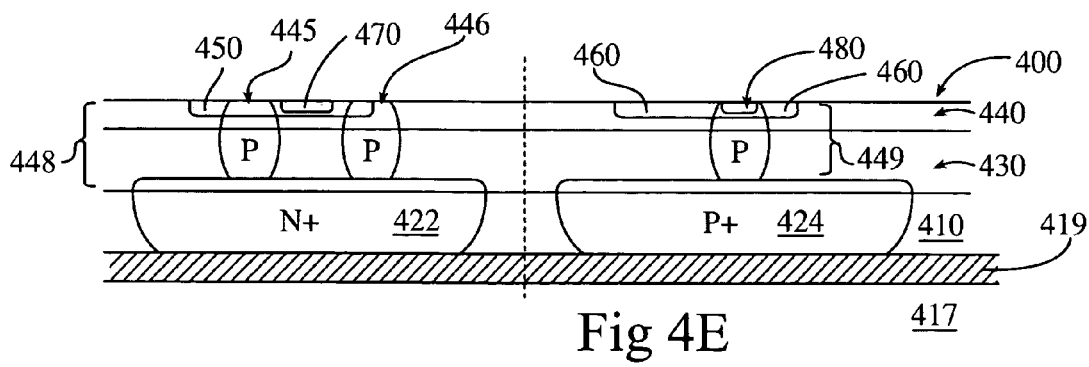

As shown in FIG. 4E, a P-type base 450 is formed in the NPN collector 448 and an N-type base 460 is formed in the PNP collector 449. To form the base 450, the surface can be masked by a first mask (not shown) and P-type ions can be implanted to form the P-type base 450. Similarly, the surface can be masked, either by the first mask or by a second mask (not shown) and N-type ions can be implanted to form the N-type base 460. Subsequently, an N-type emitter 470 can be formed in the P-type base 450 and a P-type emitter 480 can be formed in the N-type base 460. An N column, which is a depletable column, thus forms directly below the emitter 470. Similarly, a P column, which is a depletable column, forms directly below the emitter 480.

According to various embodiments, the integrated circuit can continue being processed according to procedures known to one of ordinary skill in the art. For example, an interlevel dielectric layer can be formed, contact holes can be patterned, and the various components can be electrically connected as required. Moreover, additional NPN and PNP bipolar devices, such as conventional devices of FIG. 1 can be formed on the same integrated circuit. This allows bipolar transistors having different breakdown voltages to be formed on the same device.

According to various embodiments, a double poly transistor architecture having a super junction structure is provided. The double poly transistor architecture comprising a collector having a super junction structure as described herein can be formed. Several options exist for masking the collector implants. According to various embodiments, the columns of the super junction structure can be formed by a series of implants at different energies made through an opening in a base poly. For example, an opening can be formed that exposes the emitter regions through the base poly and the collector is implanted through the opening. Outside edges of the base poly can be patterned in a subsequent step using conventional photoresist masks. Alternatively, the base poly can be patterned with a single mask to leave a pattern such that the stack of the base poly and overlying layer of oxide is thick enough to block high energy implanted ions from reaching the island. The photoresist can also pattern oversized openings to expose the emitter such that edges of the base poly stack are exposed around the perimeter of the emitter openings. An implant can then form the collector. Still further, the collector of the double poly transistor architecture can be formed after the base poly etch and before photoresist removal using an ion implantation. In this case, the field oxide should be thick enough to block the collector implant in unwanted areas.

Figure 5A:
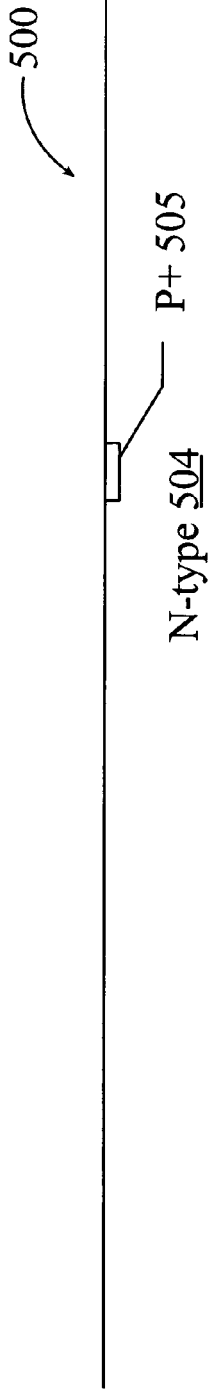

An exemplary method of forming a double poly transistor 500 is shown for example in FIGS. 5A-I. While FIGS. 5A-I depict forming a PNP bipolar transistor, it is to be understood that an NPN bipolar transistor can be similarly formed by inverting the doping scheme. Turning to FIG. 5A, integrated circuit 500 includes a P+ buried layer 502 and an N-type epitaxial layer 504 (also called a device layer) formed on the P+ buried layer 502. The N-type epitxial layer 504 forms the N-type collector columns of the resulting bipolar transistor. A P+ sinker implant 505 can also be formed by implanting P-type ions into the N-type epitaxial layer 504. According to various embodiments, the P+ sinker implant can be boron or the like, and can be implanted with an energy from about 30 KeV to about 70 KeV and a dose from about 8E14 ions/cm$^2$ to about 5E15 ions/cm$^2$. In still further embodiments, the P+ sinker implant can be implanted with an energy of about 50 KeV and a dose of about 2E15 ion/cm$^2$.

Figure 5B:
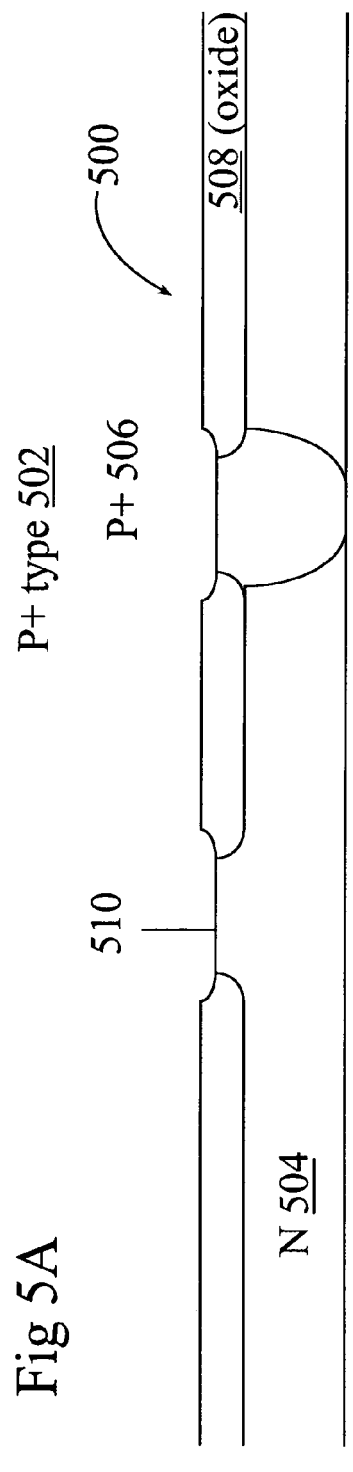

In FIG. 5B, a field oxide 508 is formed and the P+ sinker 505 implant is diffused into the epitaxial layer 504 so as to form P+ sinker 506 that contacts the buried layer 502. The field oxide 508 is formed so as to expose the P+ sinker 506 and a portion 510 of the epitaxial layer 504 that will form the device region. According to various embodiments, the field oxide 508 can be a local oxidation oxide, such as LOCOS, or a shallow trench isolation oxide (STI). It will be understood, however, that other field oxide techniques are also contemplated.

Figure 5C:
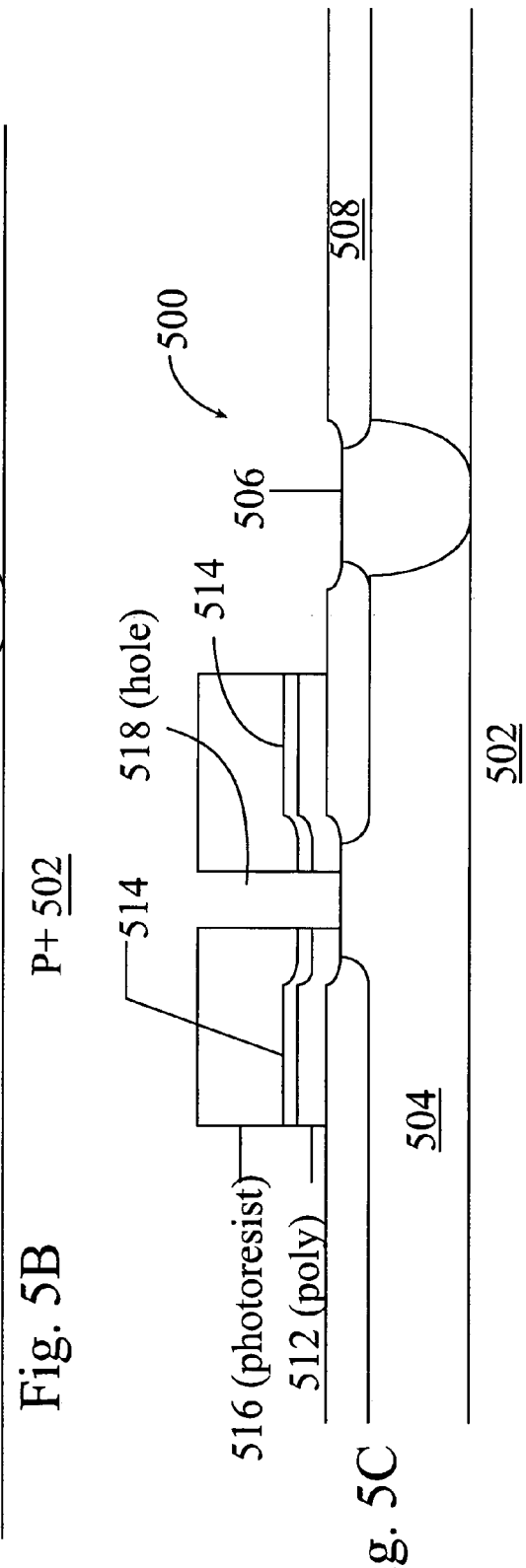
Figure 5D:
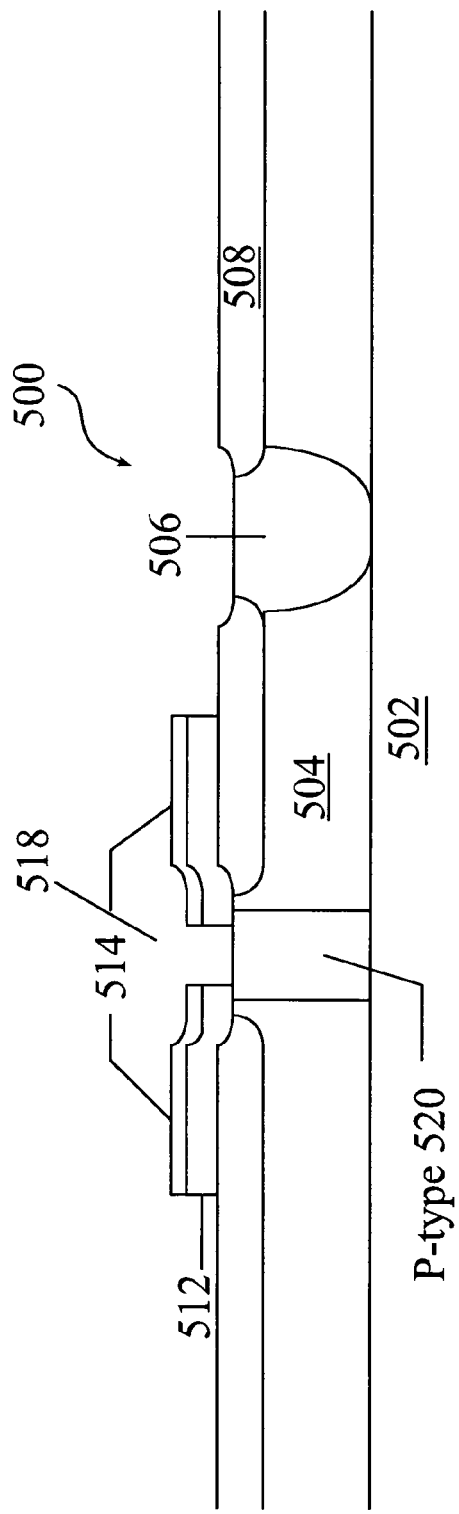

FIG. 5C shows a patterned first poly that acts as a base contact 512 where the base contact 512 is patterned using a patterned oxide 514 and a patterned photoresist 516. The base contact 512 can be patterned to expose the epitaxial layer 504 through a hole 518 (also called an opening). P-type ions can be implanted into the epitaxial layer 504 through the hole 518. According to various embodiments, the P-type ions can be implanted with an energy of 1 MeV and dose of 1.4 E12 cm$^{-2}$; energy of 750 KeV and dose of 1.4 E12 cm$^{-2}$; energy of 500 KeV and dose of 1.4 E12 cm$^{-2}$; energy of 300 keV and dose of 1.0 E12 cm$^{-2}$; energy of 140 KeV and dose of 1.2 E12 cm$^{-2}$; and energy of 30 KeV and dose of 6.2 E11 cm$^{-2}$. The patterned photoresist 516 can be removed and the device 500 can be heated to diffuse the implanted P-type ions so as to form a column 520 in the epitaxial layer 504, as shown in FIG. 5D. Thus, the column 520 can be a region in the epitaxial layer 504 (also called the collector) that is doped to a net P-type conductivity. Moreover, the column 520 can span the thickness of the epitaxial layer 504 so as to contact the buried layer 502.

Figure 5E:
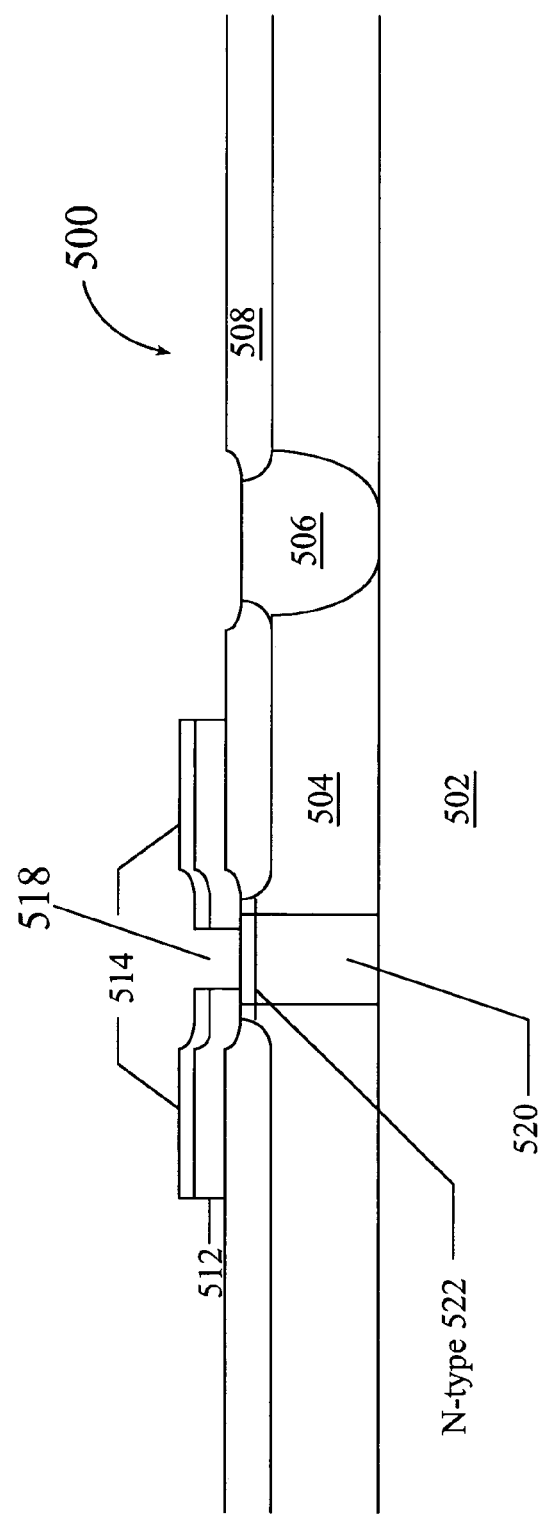

As shown in FIG. 5E an N-type intrinsic base 522 can be formed by implanting N-type ions using the base contact 512 and the patterned oxide 514 as a mask. Subsequently, the intrinsic base implant can be annealed so as to form the intrinsic base 522 that is contacted by the base contact 512. The intrinsic base 522 can be thus be formed in a surface portion of the epitaxial layer 504.

FIG. 5F shows the device 500 after spacers 524 have been formed on the sidewalls of the hole 518. Spacers 526 can also be formed on the sides of the base contact 512 and patterned oxide 514. Spacers 524 and 526 can be formed by etching an insulating layer that has been deposited over the device 500. According to various embodiments, the spacers can comprise an oxide, a nitride, or an oxinitride, or combinations thereof. For example, the spacers can comprise silicon oxide. Alternatively, the spacers can comprise a thin layer of silicon oxide (such as ≦ about 100 Å) contacting the intrinsic base 522 with a layer of nitride disposed over the thin silicon oxide.

Subsequently, a layer of conducting material, such as polysilicon can be deposited over the device 500. The conducting material can then be patterned to form a second poly that acts as an emitter contact 528 and which is disposed between the sidewall spacers 524, as shown in FIG. 5G. Moreover, the conducting material can be patterned to form a collector contact 530 over the P+ sinker 506. According to various embodiments, an emitter 532 can be formed in a portion of the epitaxial layer 504 exposed by the hole 518 under the emitter contact. For example, the emitter 532 can be formed in the portion of the epitaxial layer 504 exposed between the spacers 526. Thus, the emitter 532 contacts the epitaxial layer 504. According to some embodiments, the emitter 532 can be formed by diffusing dopants into the intrinsic base 522 from the conducting material that forms the emitter contact 528. While in other embodiments, the emitter 532 can be formed by ion implanting dopants into the intrinsic base 522. Thus, the emitter 532 can be formed to be self aligned over the collector column 520.

Figure 5H:
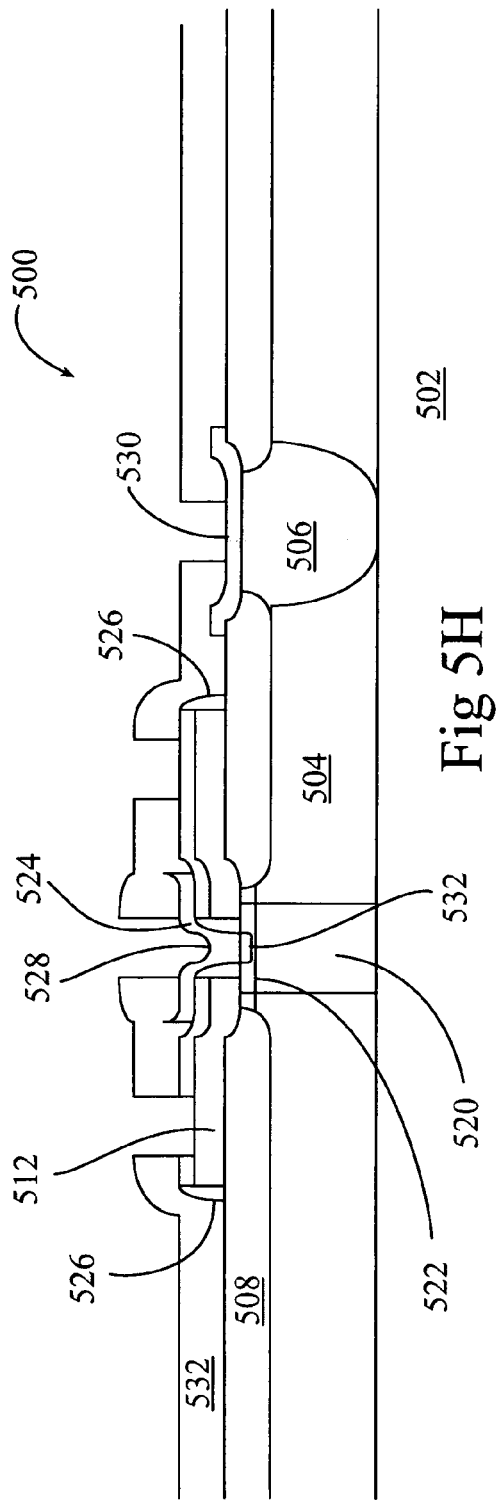
Figure 5I:
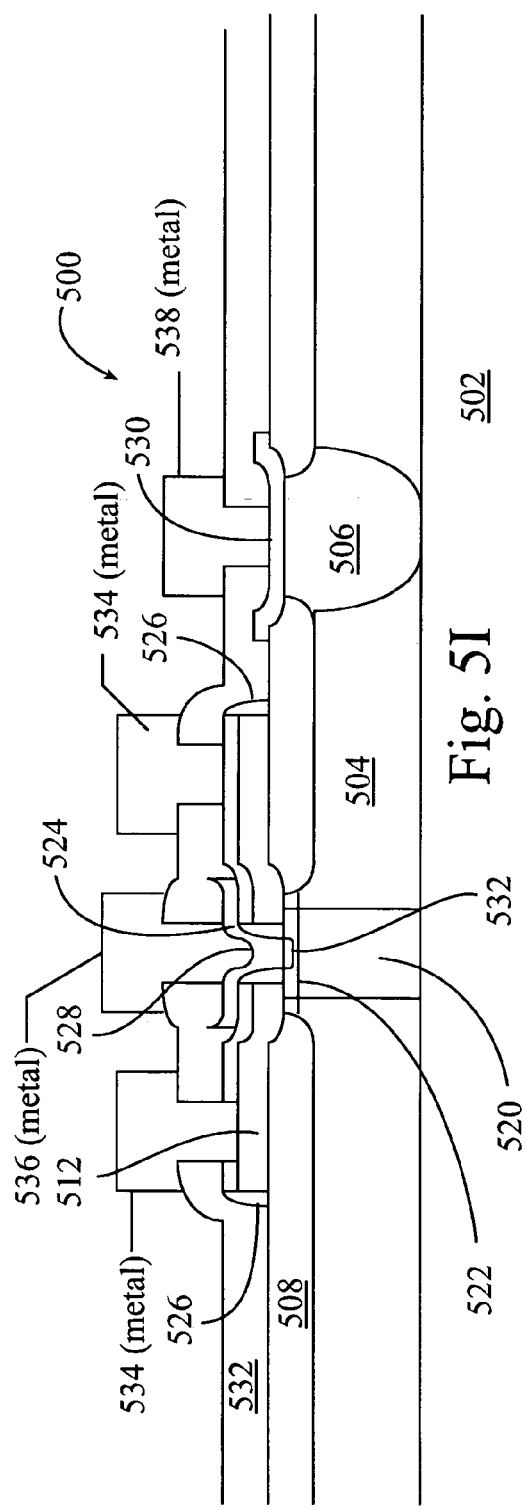

In FIG. 5H an interlevel dielectric (ILD) 532 can be deposited and patterned to form windows that expose portions of the base contact 512, emitter contact 528, and collector contact 530. The ILD can be an oxide. As shown in FIG. 5I, a metal layer can be deposited over the ILD 532 and patterned so as to form base contact metal 534, emitter contact metal 536, and collector contact metal 538 through the patterned windows. According to various embodiments, the metal layer can comprise aluminum, titanium, or other contact metals as will be known to one of ordinary skill in the art.

In the case of the single poly transistor architecture, the opening through the base poly can be used to define the emitter area and the super junction column self aligned thereunder.

Figure 6A:
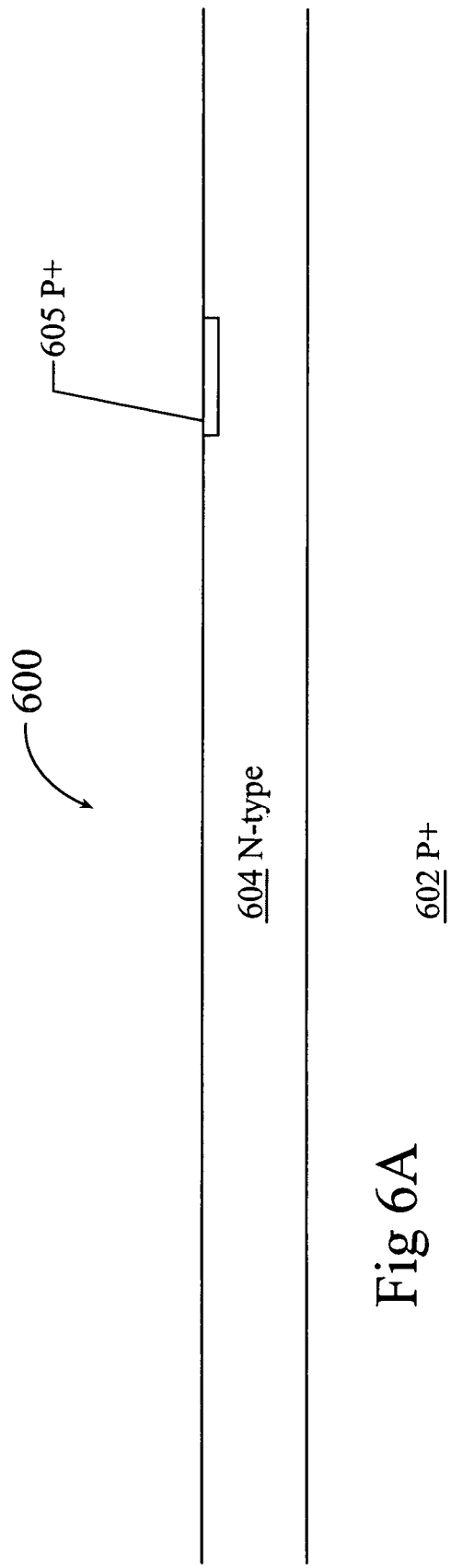
FIGS. 6A-6I depict schematic representations of a method for forming an integrated circuit device comprising a PNP single polycrystalline silicon bipolar transistor architecture comprising a super junction structure according to various embodiments of the invention.

FIGS. 6A-I depict a method of forming an integrated circuit having a super junction structure in a single poly PNP bipolar transistor 600. While FIGS. 6A-6I depict forming a PNP bipolar transistor, it is to be understood that an NPN bipolar transistor can be similarly formed by inverting the doping scheme. Turning to FIG. 6A, transistor 600 includes a P+ buried layer 602 and an N-type epitaxial layer 604 (also called a device layer) formed on the P+ buried layer 602. Portions of the N-type epitxial layer 604 form N-type collector columns of the resulting bipolar transistor. A P+ sinker implant 605 can also be formed by implanting P-type ions into the N-type epitaxial layer 604. According to various embodiments, boron (or another P-type dopant) can be implanted with an energy from about 30 KeV to about 100 KeV with a dose from about 8E14 ions/cm² to about 4E15 ion/cm². In still further embodiments, boron (or another P-type dopant) can be implanted with an energy of about 50 KeV and a dose of about 2E15 ions/cm².

Figure 6B:
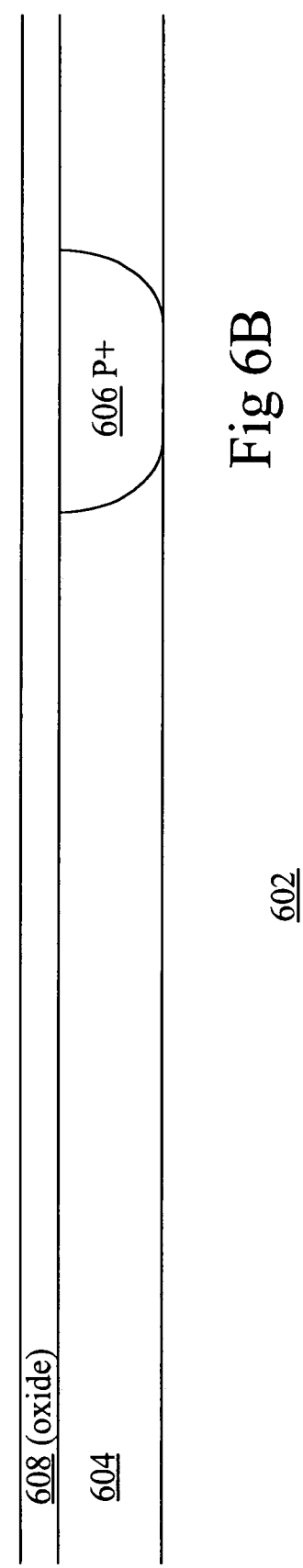

In FIG. 6B, an insulator, such as a field oxide 608 is grown and the P+ sinker 605 implant is diffused into the epitaxial layer 604 so as to form P+ sinker 606 that contacts the buried layer 602. According to various embodiments, the field oxide 608 can be also be a local oxidation oxide, such as LOCOS, or a shallow trench isolation oxide (STI). It will be understood, however, that other field oxide techniques are also contemplated.

Figure 6C:
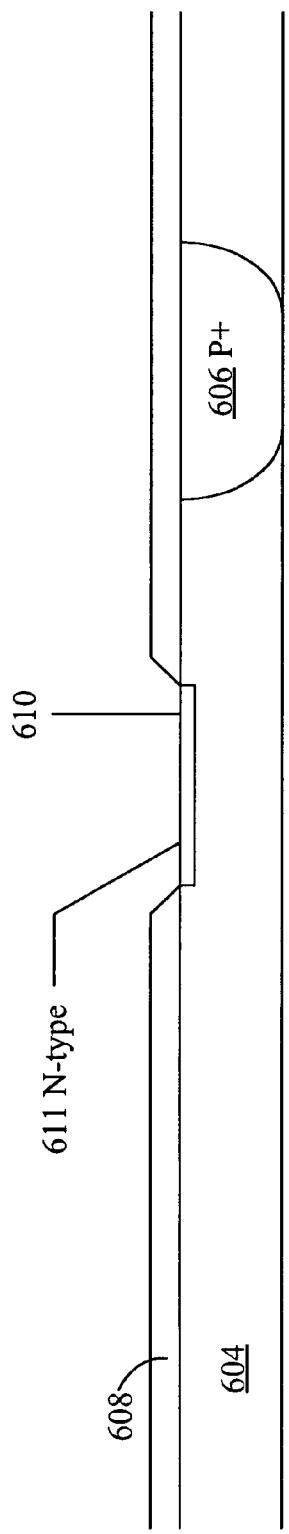

In FIG. 6C the field oxide 608 is patterned to form a hole (also called an opening) so as to expose a portion 610 of the epitaxial layer 604 that will form the device region. FIG. 6C also shows the result of an N-type base implantation 611 into the exposed portion of epitaxial layer 604. According to various embodiments, phosphorous (or another N-type dopant) can be implanted with an energy from about 30 KeV to about 100 KeV with a dose from about 2E13 ions/cm² to about 5E14 ion/cm². In still further embodiments, phosphorous (or another N-type dopant) can be implanted with an energy of about 50 KeV and a dose of about 5E13 ions/cm² to about 2E14 ions/cm².

Figure 6D:
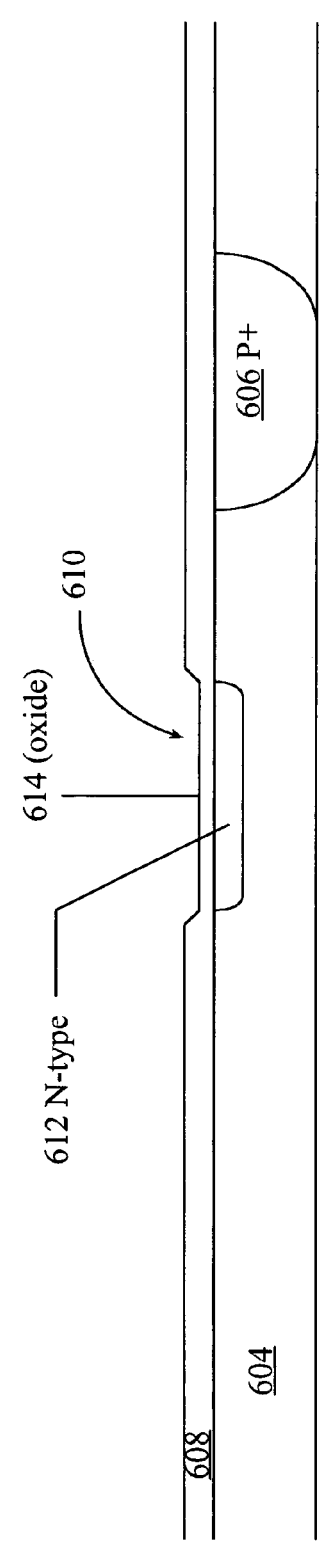
Figure 6E:
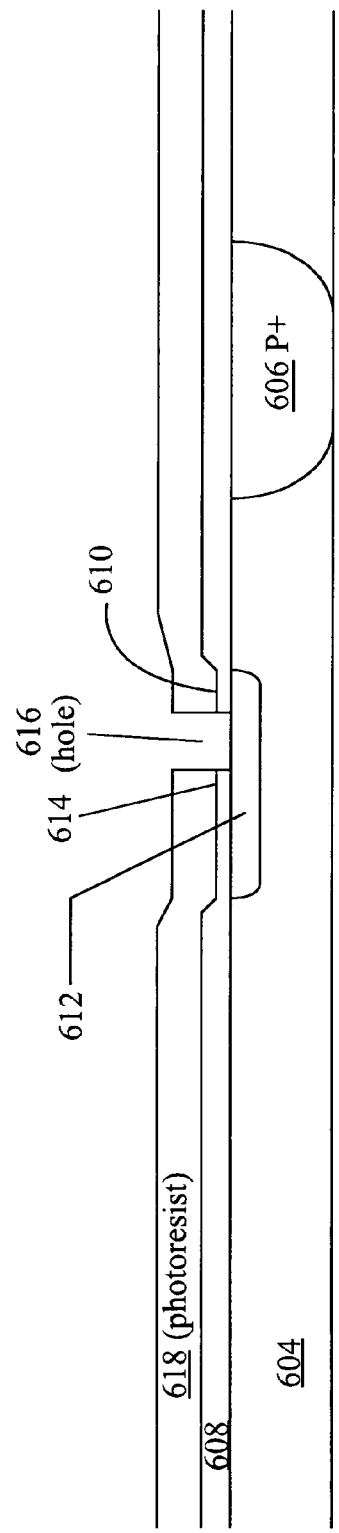
Figure 6F:
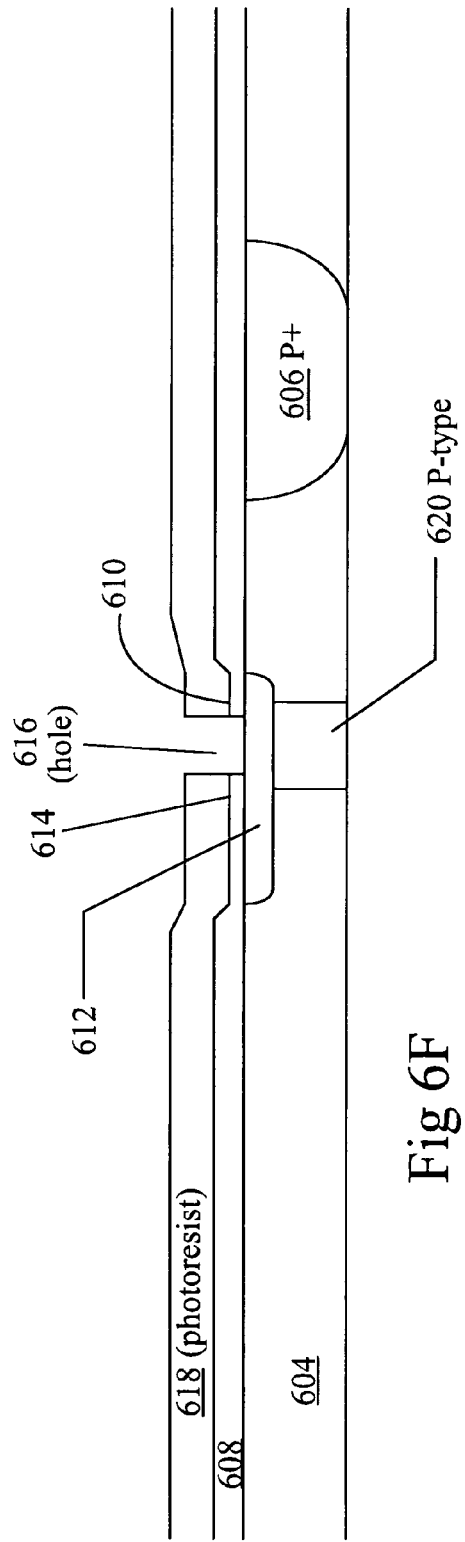

In FIG. 6D, N-type base implantation 611 has been diffused to form an N-type base 612. A base oxide 614 can also be grown over the N-type base 612. As shown in FIG. 6E, an opening 616 through the base oxide 614 is formed using a patterned photoresist 618 so as to expose an area of the device layer. In FIG. 6F a P-type collector column 620 can be formed with the mask used to form the opening 616. P-type ions can be implanted through the opening so that the collector column 620 is self aligned to the opening 616. According to various embodiments, the P-type implants can be made boron (or another P-type dopant) with an energy of 1 MeV and dose of 1.4 E12 cm$^{-2}$; energy of 750 KeV and dose of 1.4 E12 cm$^{-2}$; energy of 500 KeV and dose of 1.4 E12 cm$^{-2}$; energy of 300 KeV and dose of 1.0 E12 cm$^{-2}$; energy of 140 KeV and dose of 1.2 E12 cm$^{-2}$; and energy of 30 KeV and dose of 6.2 E11 cm$^{-2}$. Moreover, the collector column 620 can span the thickness of the epitaxial layer 604 so as to contact the buried layer 602.

Figure 6G:
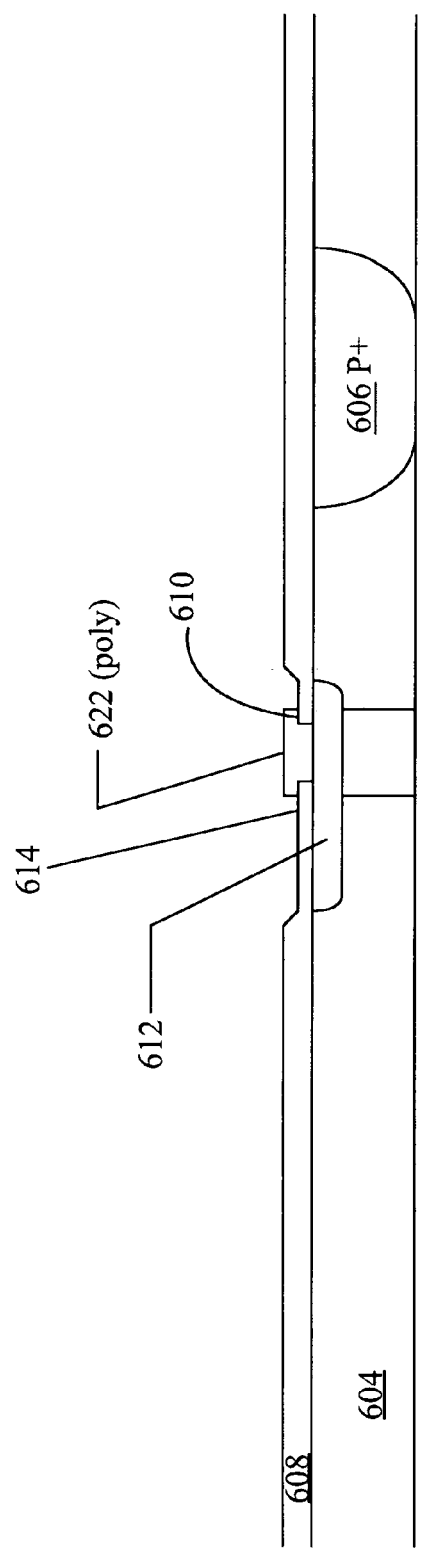
Figure 6H:
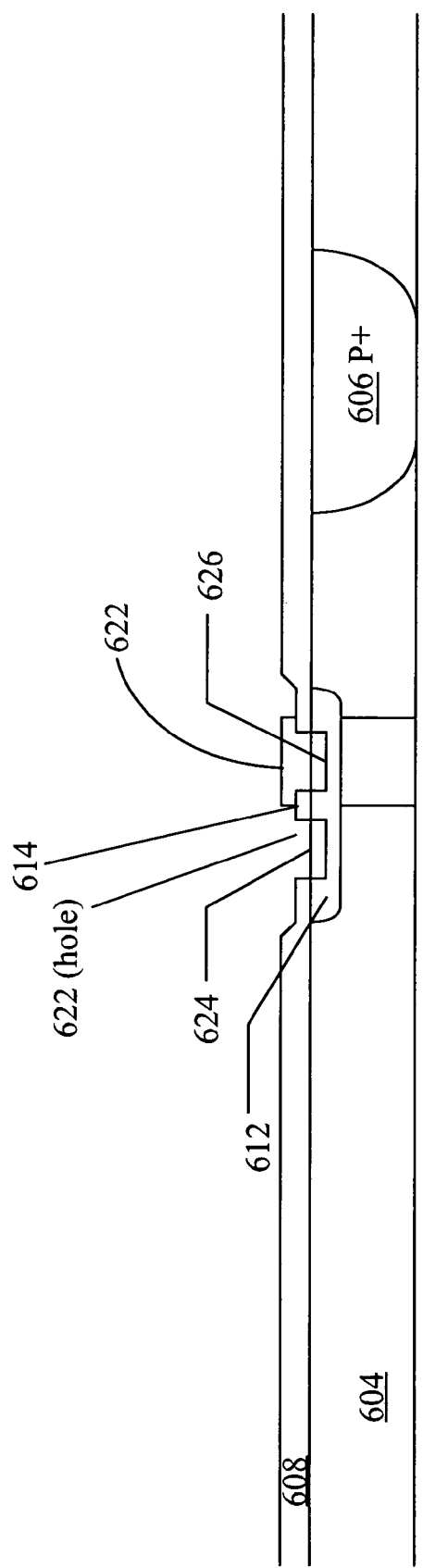

A heavily doped emitter poly 622 can then be formed over the opening 616 so that the emitter area is defined by the opening 616 that defines the area where the emitter poly contacts the base 612, as shown in FIG. 6G. At this point in the process the collector column 620 can be properly diffused and activated after the photoreist 618 has been removed. According to various embodiments, the collector can be diffused before depositing the emitter poly. FIG. 6H shows a patterned hole 622 that allows dopants to be diffused into the base so as to form a base contact region 624. In FIG. 6H, dopants from the heavily doped emitter poly 622 can be diffused to form an emitter 626 positioned, and self-aligned above the collector column 620.

Figure 6I:
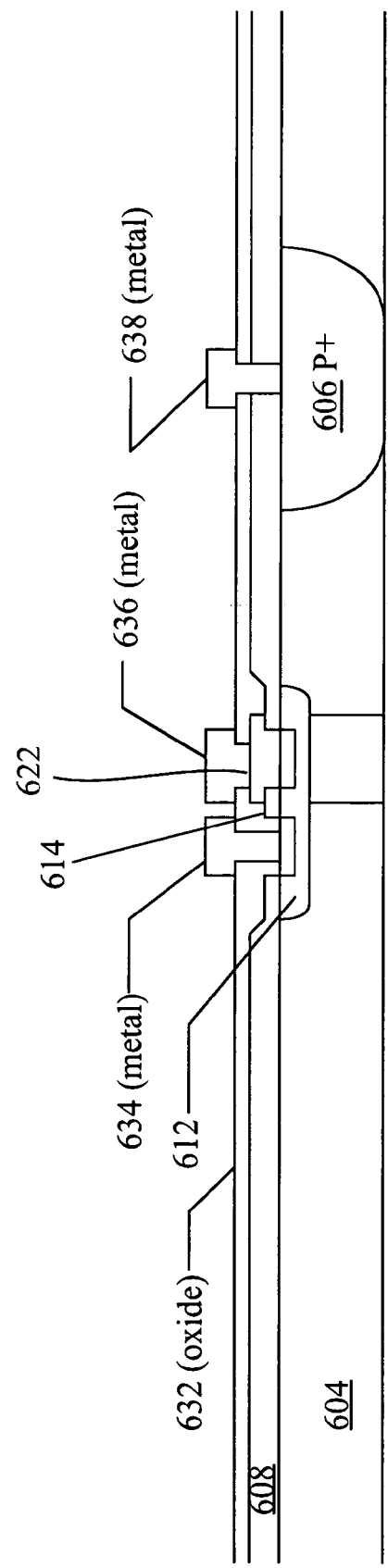

FIG. 6I shows a patterned ILD 632 having trenches that expose the base contact region 624. The ILD can be deposited over the emitter poly 622. As shown in FIG. 6I, a metal layer can be deposited over the ILD 632 and patterned so as to form base contact metal 634, emitter contact metal 636, and collector contact metal 638 through the patterned trenches. According to various embodiments, the metal layer can comprise aluminum, titanium, or other contact metals as will be known to one of ordinary skill in the art.

According to various embodiments, the absolute value of VCB can be less than the absolute value of $BV_{CEO}$ when the portion of the column under the emitter totally depletes. This can be true for a PNP device where VCB and $BV_{CEO}$ are both negative as well as the case for an NPN device where they both are positive. According to various embodiments of an NPN device, the region that depletes can be the column in the epitaxial layer, in which the collector is formed, under the emitter. Moreover, according to various embodiments, the column under the emitter can be the column that depletes regardless of how the device is formed.

The collector-base capacitance of the devices made with the depletable columns will differ from that of the conventional device. For example, it may initially be higher. This can be a result of the higher doping of the columns and increased junction area. The collector-base capacitance, however, will drop abruptly when the columns totally deplete.

According to various embodiments, devices made with depletable columns under the emitter, such as those described herein, can have BVCEO of at least 69 V and an HFE of about 83 for an NPN device, and at least 82 V and an HFE of about 101, for a PNP device. HFE is understood to be a measure of current gain and can be described, generally, as the ratio of collector current to base current at a specified collector to emitter voltage. This is in contrast to a BVCEO of 37 V for a conventional NPN device and 40 V for a conventional PNP device made with the same doped layers but without the depletable columns under the emitters. Moreover, these new devices can have lower $R_{cs}$, such as 1.5 kΩ, than devices made with similar emitter areas.

Figure 7:
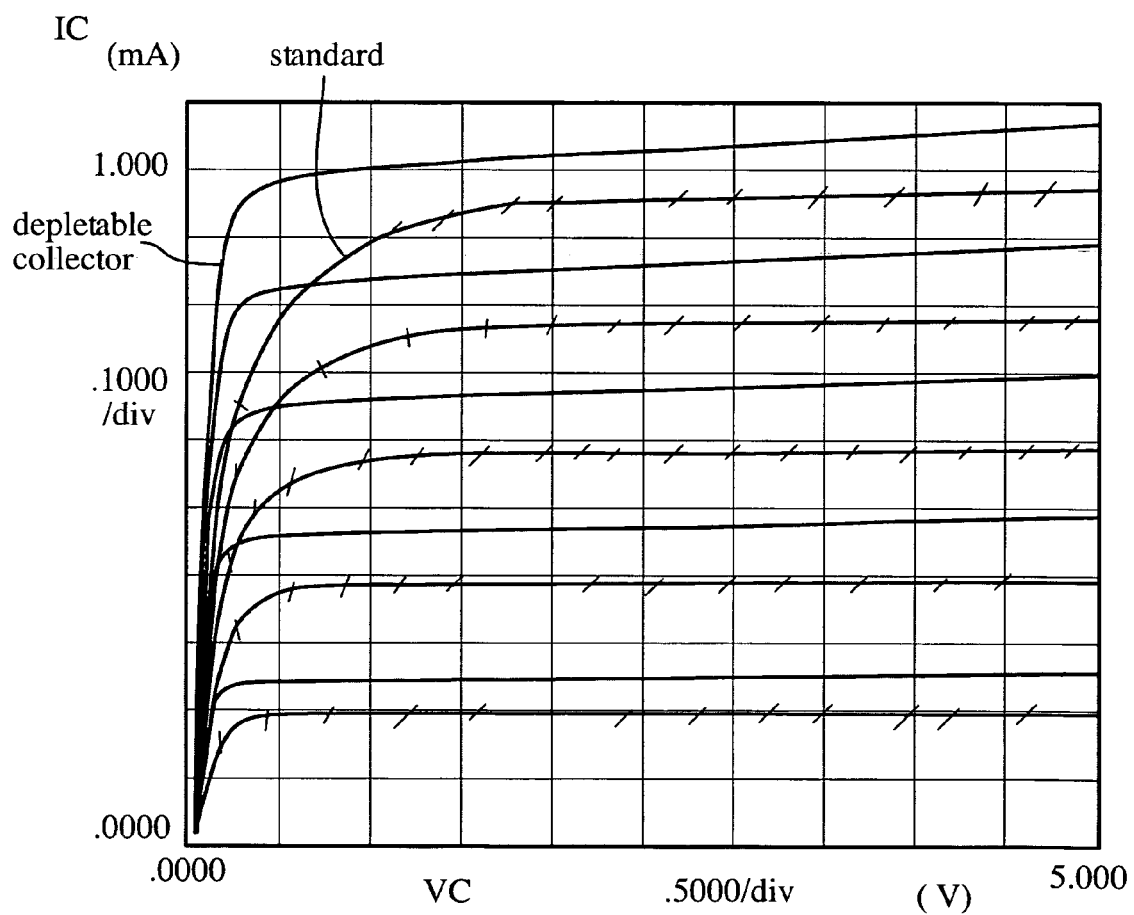
FIG. 7 is a plot of exemplary collector resistances achieved using the super junction structures described herein in comparison to conventional collector structures.
Figure 8:
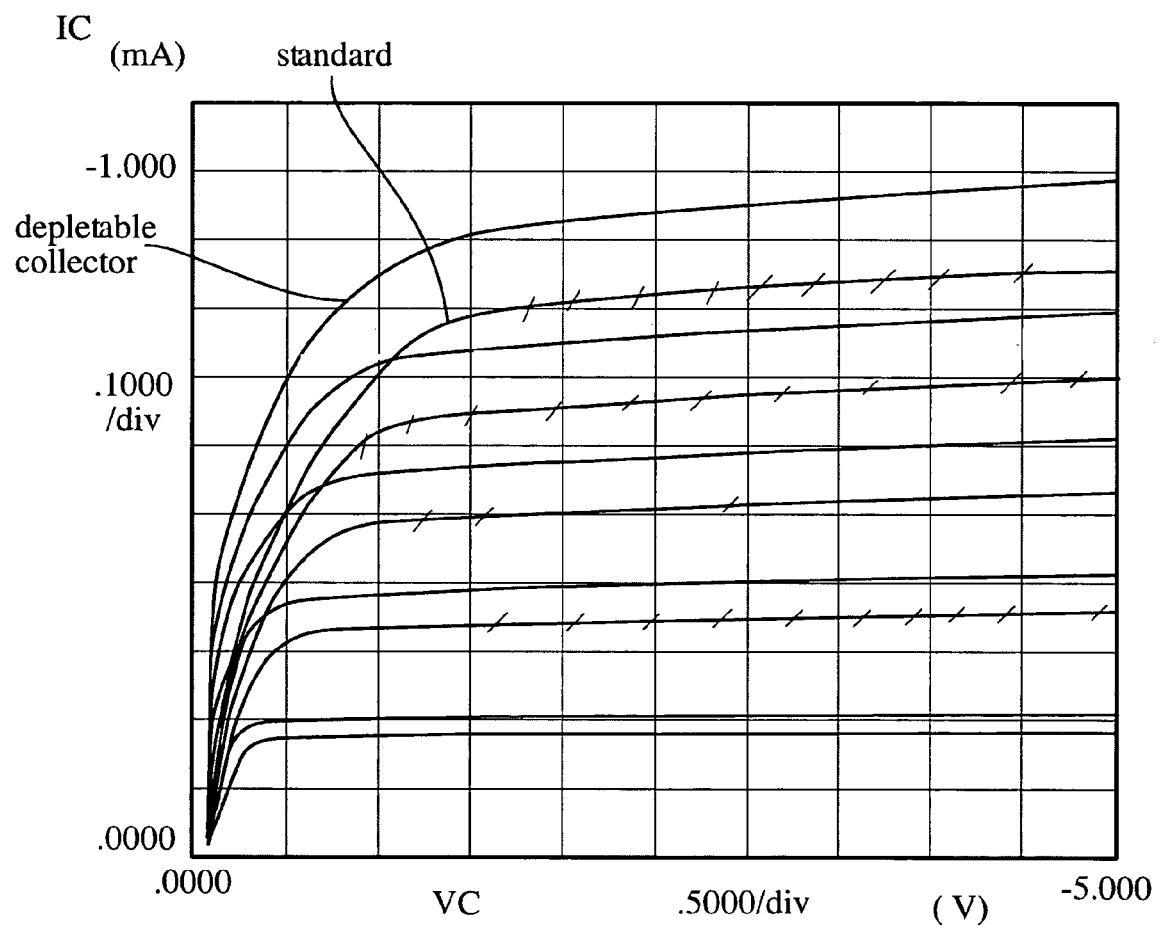
FIG. 8 is another plot of exemplary collector resistances achieved using the super junction structures described herein in comparison to conventional collector structures.

Exemplary collector resistances achieved using the super junction structures described herein (shown with a solid line) in comparison to collector resistances conventional collector structures (shown with a solid line with slashes) are shown in FIGS. 7 and 8. In these figures, the NPN collector doping is about 2E15 atoms cm$^{-3}$, the columns length is about 5 microns and the column thickness is about 8 microns. The PNP collector doping is about 4E15 atoms cm$^{-3}$, the column length is about 4 microns and the column thickness is about 4 microns.

According to various embodiments, the devices of the present invention comprise a depletable collector column under the emitter and the devices can achieve a BVCEO about twice that of conventional devices. Moreover, the NPN devices of the present invention comprising a depletable collector column under the emitter can achieve an Rcs about three times lower than that of conventional devices. Still further, the PNP devices of the present invention comprising a depletable collector column under the emitter can achieve an Rcs about 30% less than conventional devices.

Figure 9:
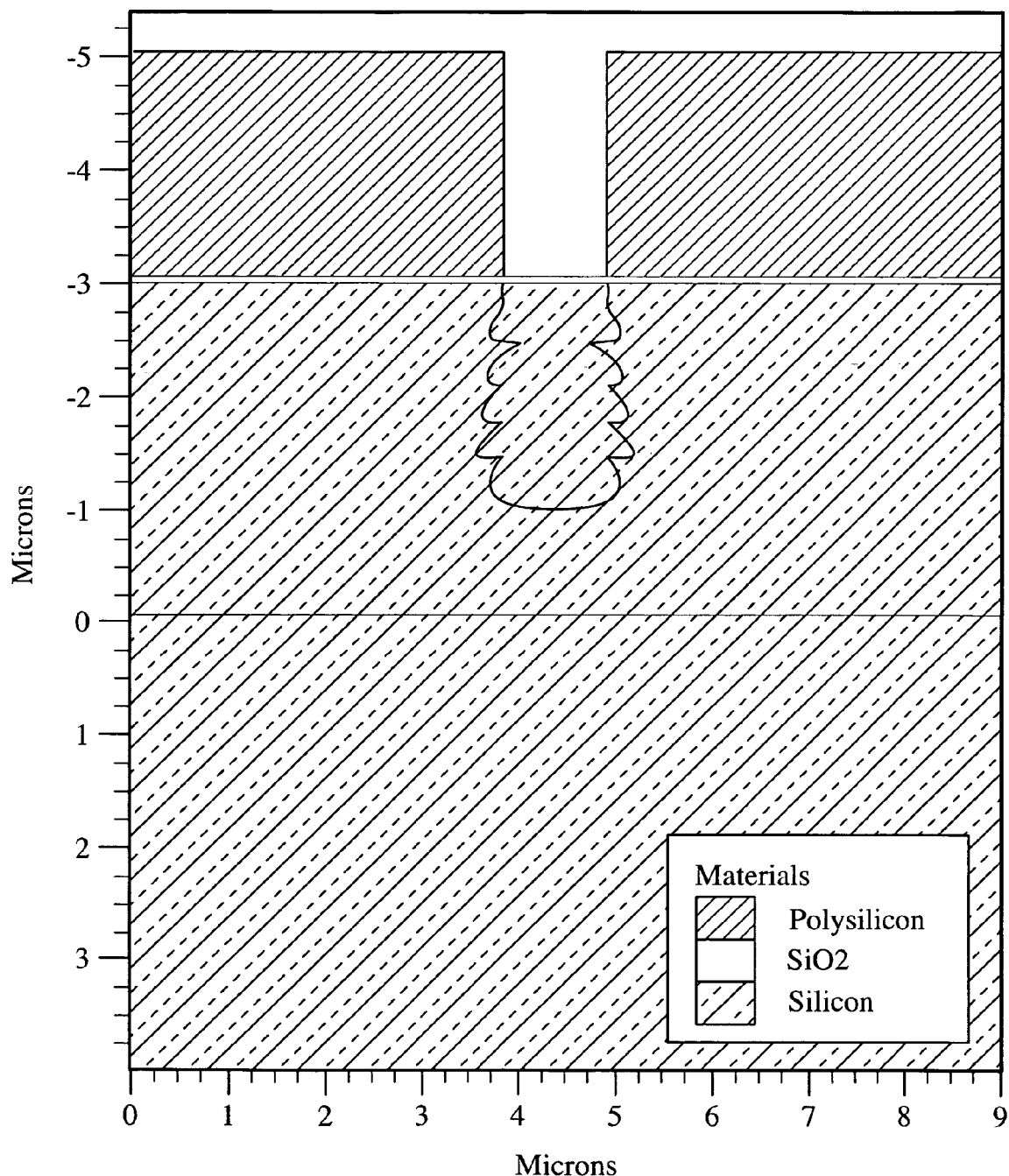
FIG. 9 depicts an exemplary dopant profile for a super junction structure before a diffusion step.
Figure 10A:
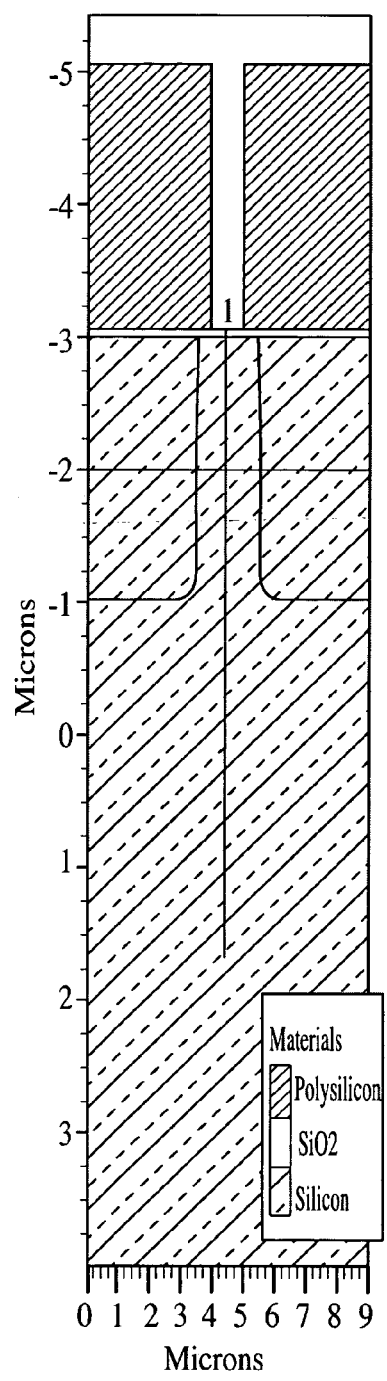
FIGS. 10A-C depict exemplary dopant profiles for a super junction structure after a diffusion step.
Figure 10B:
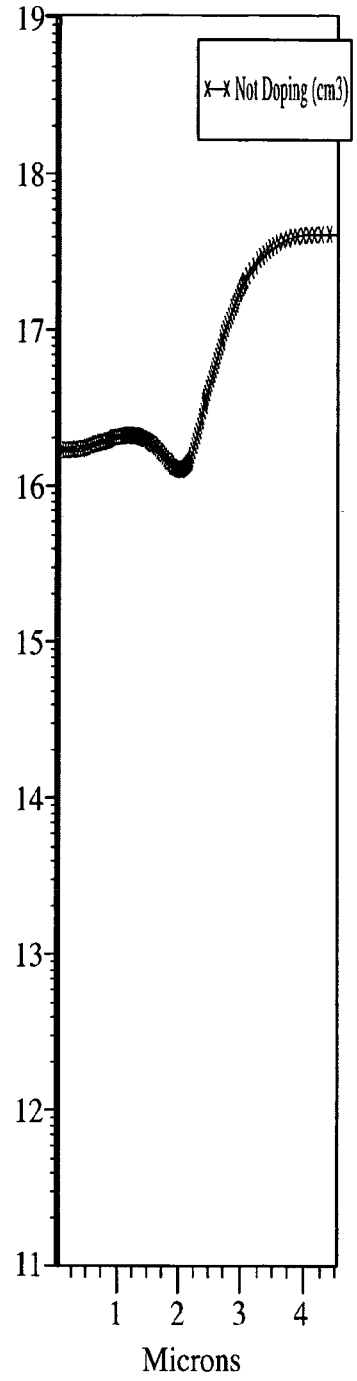
Figure 10C:
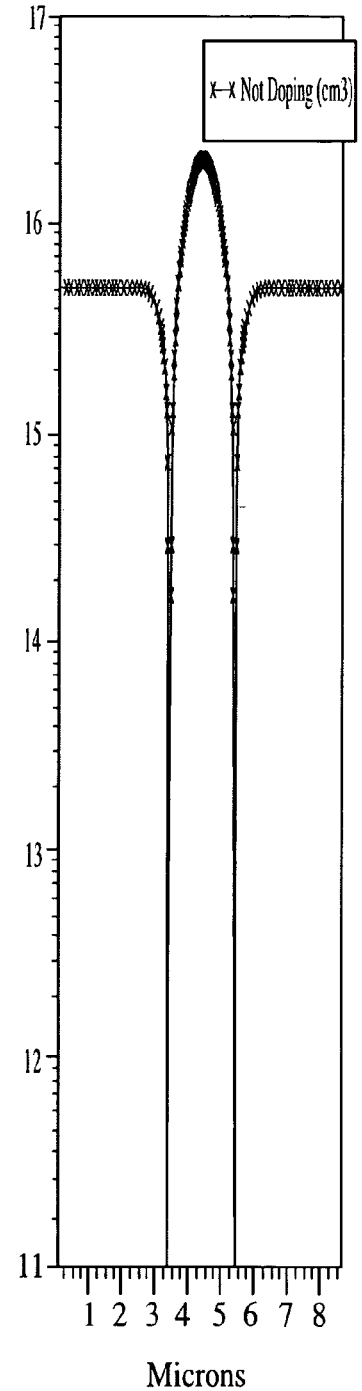

In a still further exemplary embodiment, a PNP bipolar transistor comprising a super junction structure described herein can have a breakdown of about 30 V. In this example, the column under the emitter can be about 2.3 μm long before the base is formed. The columns of the super junction can be formed using, for example, six boron implants, with the following parameters: energy of 1 MeV and dose of 1.4 E12 cm$^{-2}$; energy of 750 KeV and dose of 1.4 E12 cm$^{-2}$; energy of 500 KeV and dose of 1.4 E12 cm$^{-2}$; energy of 300 KeV and dose of 1.0 E12 cm$^{-2}$; energy of 140 KeV and dose of 1.2 E12 cm$^{-2}$; and energy of 30 KeV and dose of 6.2 E11 cm$^{-2}$. Moreover in this exemplary embodiment, the ions can be implanted into an N-type epitaxial layer about 3 µm thick doped to a concentration of about 5.0 E15 cm$^{-3}$. The epitaxial layer can be formed on a buried layer doped to a concentration of about 2.0 E17 cm$^{-3}$. The dopant of the buried layer can be, for example boron. Still further, the super junction column implants can be made through a 1.0 µm wide mask opening and the dopants can be diffused, for example at 1200° C. for about 15 min. An exemplary dopant profile for before the diffusion is shown in FIG. 9 and an exemplary dopant profile after the diffusion is shown in FIGS. 10A-C.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such features may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming an integrated circuit comprising a bipolar transistor, the method comprising:
    forming a device layer over a substrate;
    forming a buried region in the device layer;
    forming a first layer doped to a net first conductivity over the device layer;
    forming at least one second conductivity type region using a dopant material of a second conductivity type in the first layer, wherein the at least one second conductivity type region is bounded on its sides by at least one region doped to the first conductivity type;
    forming a base region in a portion of the first layer; and
    forming an emitter in a portion of the base region.

2. The method of forming an integrated circuit comprising a bipolar transistor according to claim 1, wherein the emitter is formed over one of the at least one second conductivity type regions.

3. The method of forming an integrated circuit comprising a bipolar transistor according to claim 1, wherein the emitter is formed over one of the at least one first conductivity type regions.

4. The method of forming an integrated circuit comprising a bipolar transistor according to claim 1 further comprising:
    forming a second buried region in the device layer, wherein the first buried region is doped to a net first conductivity, and wherein the second buried region is doped to a net second conductivity, and further wherein an NPN bipolar transistor is formed using the first buried region and a PNP bipolar transistor is formed using the second buried region.

5. The method of forming an integrated circuit comprising a bipolar transistor according to claim 1, wherein the region over which the emitter is formed comprises a width substantially the same as a width of the emitter.

6. The method of forming an integrated circuit comprising a bipolar transistor according to claim 1, wherein the region adjacent the region over which the emitter is formed does not totally deplete under reverse bias of the collector base junction.

7. The method of forming an integrated circuit comprising a bipolar transistor according to claim 1, wherein the region over which the emitter is formed totally depletes when an absolute value of $V_{CB}$ is less than an absolute value of $BV_{CEO}$.

8. The method of forming an integrated circuit comprising a bipolar transistor according to claim 1, wherein the bipolar transistor is an NPN bipolar transistor comprising a $BV_{CEO}$ of at least 69 Volts.

9. The method of forming an integrated circuit comprising a bipolar transistor according to claim 1, wherein the bipolar transistor is an PNP bipolar transistor comprising a $BV_{CEO}$ of at least 82 Volts.

10. The method of forming an integrated circuit comprising a bipolar transistor according to claim 1, wherein the bipolar transistor is an NPN bipolar transistor, and wherein the first layer is doped with at least about $2 \times 10^{15}$ atoms/cm$^3$.

11. The method of forming an integrated circuit comprising a bipolar transistor according to claim 1, wherein the bipolar transistor is an NPN bipolar transistor, and wherein the at least one second conductivity type regions formed by diffusing the portion of the dopant material of a second conductivity type from the first epitaxial layer into the first buried region has a length of about 4 µm to about 6 µm, and further wherein the region doped to the first conductivity type has a width of about 7 µm to about 9 µm.

12. The method of forming an integrated circuit comprising a bipolar transistor according to claim 1, wherein the bipolar transistor is a PNP bipolar transistor, and wherein the at least one second conductivity type region is doped with at least about $4 \times 10^{15}$ atoms/cm$^3$.

13. The method of forming an integrated circuit comprising a bipolar transistor according to claim 1, wherein the bipolar transistor is a PNP bipolar transistor, and wherein the at least one region doped to the first conductivity type has a length of about 3 µm to about 5 µm, and further wherein the at least one region doped to the first conductivity type has a width of about 3 µm to about 5 µm.

14. The method of forming an integrated circuit comprising a bipolar transistor according to claim 1 further comprising:
    forming a second bipolar transistor, wherein the bipolar transistor has a breakdown voltage greater than the breakdown voltage of the second bipolar transistor.

* * * * *

UNITED STATES PATENT AND TRADEMARK OFFICE
CERTIFICATE OF CORRECTION

PATENT NO. : 7,285,469 B2 Page 1 of 1
APPLICATION NO. : 11/217304
DATED : October 23, 2007
INVENTOR(S) : Beasom It is certified that error appears in the above-identified patent and that said Letters Patent is hereby corrected as shown below:

Title Page, Item (73) Assignee should read
-- (73) Assignee: Intersil Americas Inc., Milpitas, CA (US) --

Signed and Sealed this

Nineteenth Day of January, 2010

David J. Kappos
*Director of the United States Patent and Trademark Office*